United States Patent [19]
Kakegawa

[11] Patent Number: 5,768,160
[45] Date of Patent: Jun. 16, 1998

[54] LOGICAL SIMULATOR WITH EVENT LOAD MEASURING AND MODEL RECREATING UNITS FOR PARALLEL PROCESSING ELEMENTS

[75] Inventor: Makoto Kakegawa, Kawasaki, Japan

[73] Assignee: Fujitsu Limited, Kawasaki, Japan

[21] Appl. No.: 683,635

[22] Filed: Jul. 15, 1996

[30] Foreign Application Priority Data

Jan. 22, 1996 [JP] Japan ................................. 8-008705

[51] Int. Cl.⁶ .................................................. G06F 15/16
[52] U.S. Cl. ........................................ 364/578; 395/500
[58] Field of Search ............................ 364/578, 488, 364/489, 440, 491, 131–136; 395/500, 200.03, 200.01, 553

[56] References Cited

U.S. PATENT DOCUMENTS

| | | | |
|---|---|---|---|
| 4,306,286 | 12/1981 | Cocke et al. ........................... | 364/200 |
| 5,442,772 | 8/1995 | Childs ................................... | 395/500 |

OTHER PUBLICATIONS

"Partitioning Strategics Within a Distributed Multilevel Logic Simulator Including Dynamic Repartition" Negoglou Simic, 1993 IEEE pp. 96–101.

"Digtributed Logic Circuit Simulation in a Network Workstations" Luben beianor, 1995 IEEE, pp. 304–310.

"DiPacs. A New Concept for Parallal Circuit Simulation" Volkhard Klinger. 1995 IEEE, pp. 32–41.

*Primary Examiner*—Kevin J. Teska
*Assistant Examiner*—A. S. Roberts
*Attorney, Agent, or Firm*—Armstong, Westerman, Hattori, McLeland & Naughton

[57] ABSTRACT

A logical simulator that creates a logical simulation model that can equally distribute the load to each processing element and certainly suppress a decrease in a parallel processing efficiency due to each processing element waiting for its synchronous operation, thus increasing the speed of the logical simulation. The logical simulator includes a load measuring unit for measuring the load of each of processing elements at a logical simulation execution time, and a load data file for holding as load data the result measured by the load measuring unit. The model creating unit creates a logical simulation model with a small load bias of each of the processing elements at the logical simulation execution time, based on the measured result from the load measuring unit. The logical simulator is applicable to check for the correctness in design before fabricating digital equipment such as a digital computer formed of logical circuits.

19 Claims, 30 Drawing Sheets

| GATE NUMBER | #1 | #2 | #3 |
|---|---|---|---|
| INPUT PATTERN | 0<br>0<br>0<br>0<br>1<br>⋮ | 0<br>0<br>1<br>1<br>0<br>⋮ | 0<br>1<br>0<br>1<br>0<br>⋮ |

FIG. 15

| GATE NUMBER | *1 | *2 | *3 | *4 | *5 |
|---|---|---|---|---|---|
| EVENT NUMBER | 8 | 5 | 3 | 7 | 2 |
| GATE NUMBER | *6 | *7 | *8 | *9 | *10 |
| EVENT NUMBER | 7 | 5 | 10 | 2 | 2 |

FIG. 16

| PE NUMBER | 0 | 1 | 2 |
|---|---|---|---|
| EVENT NUMBER | 22 | 15 | 14 |
| GATE NUMBER | 1,2,4,5 | 3,6,7 | 8,9,10 |

FIG. 23

| ITEM NUMBER | PATH NAME | TOTAL EVENT NUMBER | ACCUMULATED NUMBER OF TIMES | AVERAGE EVENT NUMBER |
|---|---|---|---|---|
| 1 | /A | 15 | 2 | 7.5 |
| 2 | /B | 9 | 2 | 4.5 |
| 3 | /C | 15 | 3 | 5 |
| 4 | /D/A | 9 | 3 | 3 |
| 5 | /D/B | 6 | 3 | 2 |
| 6 | /E/A | 13 | 2 | 6.5 |
| 7 | /F | 4 | 2 | 2 |
| 8 | /E/B | 9 | 2 | 4.5 |
| 9 | /G | 2 | 1 | 2 |
| 10 | /H | 3 | 2 | 1.5 |

FIG. 25

| ITEM NUMBER | GATE NUMBER | PE NUMBER | EVENT NUMBER | PATH NAME |
|---|---|---|---|---|
| 1 | #1 | 0 | 8 | /A |
| 2 | #2 | 0 | 5 | /B |
| 3 | #4 | 0 | 7 | /D/A |
| 4 | #5 | 0 | 4 | /D/B |
| 5 | #3 | 1 | 5 | /C |
| 6 | #6 | 1 | 7 | /E/A |
| 7 | #7 | 1 | 5 | /F |
| 8 | #8 | 2 | 6 | /E/B |
| 9 | #9 | 2 | 2 | /G |
| 10 | #10 | 2 | 2 | /H |

FIG. 27

| ITEM NUMBER | PATH NAME | TOTAL EVENT NUMBER | ACCUMULATED NUMBER OF TIMES | AVERAGE EVENT NUMBER |
|---|---|---|---|---|
| 1 | /A | 60 | 3 | 20 |
| 2 | /B | 80 | 4 | 20 |
| 3 | /C | 40 | 2 | 20 |
| 4 | /D/A | 90 | 3 | 30 |
| 5 | /D/B | 60 | 3 | 20 |
| 6 | /E/A | 120 | 3 | 40 |
| 7 | /F | 120 | 3 | 40 |
| 8 | /E/B | 90 | 3 | 30 |
| 9 | /G | 50 | 3 | 25 |
| 10 | /H | 50 | 3 | 25 |

| GATE NUMBER | #1 | #2 | #3 |
|---|---|---|---|
| INPUT PATTERN | 0<br>0<br>0<br>0<br>1<br>1<br>1<br>1 | 0<br>0<br>1<br>1<br>0<br>0<br>1<br>1 | 0<br>1<br>0<br>1<br>0<br>1<br>0<br>1 |

| GATE NUMBER | #1 | #2 | #3 | #4 | #5 | #6 | #7 | #8 | #9 | #10 | TOTAL |
|---|---|---|---|---|---|---|---|---|---|---|---|
| EVENT NUMBER | 2 | 4 | 8 | 3 | 2 | 4 | 4 | 10 | 4 | 10 | 51 |

FIG.34(a)

| PROCESSOR NUMBER | 0 | 1 |
|---|---|---|
| EVENT NUMBER | 20 | 31 |
| GATE NUMBER (ALLOCATED GATE NUMBER) | 1, 3, 5, 7, 9 | 2, 5, 6, 9, 10 |

FIG.34(b)

| PROCESSOR NUMBER | 0 | 1 |
|---|---|---|
| EVENT NUMBER | 27 | 24 |
| GATE NUMBER (ALLOCATED GATE NUMBER) | 1, 3, 4, 7, 8 | 2, 5, 6, 9, 10 |

FIG. 35

| INPUT PATTERN | GENERAL MODEL | MODEL OF THE PRESENT EMBODIMENT |
|---|---|---|
| 0 0 0 | PE0⊢1⊢3⊢5⊢FREE⊢FREE⊢7⊢9⊣<br>PE1⊢2⊢FREE⊢4⊢FREE⊢6⊢8⊢10⊣ | PE0⊢1⊢3⊢4⊢FREE⊢7⊢8⊢FREE⊢FREE⊣<br>PE1⊢2⊢FREE⊢5⊢6⊢FREE⊢FREE⊢9⊢10⊣ |
| 0 0 1 | PE0⊢3⊢FREE⊢FREE⊢FREE⊣<br>PE1⊢FREE⊢8⊢10⊣ | PE0⊢3⊢FREE⊢FREE⊣<br>PE1⊢FREE⊢8⊢10⊣ |
| 0 1 0 | PE0⊢3⊢4⊢FREE⊢FREE⊢FREE⊢FREE⊣<br>PE1⊢2⊢4⊢8⊢8⊢10⊢10⊣ | PE0⊢3⊢4⊢8⊢8⊢FREE⊣<br>PE1⊢2⊢FREE⊢6⊢FREE⊢10⊢10⊣ |
| 0 1 1 | PE0⊢3⊢FREE⊢FREE⊢7⊢9⊣<br>PE1⊢FREE⊢6⊢8⊢10⊢FREE⊣ | PE0⊢3⊢8⊢7⊢FREE⊣<br>PE1⊢FREE⊢6⊢10⊢9⊣ |
| 1 0 0 | PE0⊢1⊢3⊢FREE⊢FREE⊢7⊢9⊣<br>PE1⊢2⊢FREE⊢6⊢8⊢10⊢FREE⊣ | PE0⊢1⊢3⊢8⊢7⊢FREE⊣<br>PE1⊢2⊢FREE⊢6⊢10⊢9⊣ |
| 1 0 1 | PE0⊢3⊢FREE⊢FREE⊢FREE⊣<br>PE1⊢FREE⊢8⊢10⊣ | PE0⊢3⊢8⊢FREE⊣<br>PE1⊢FREE⊢FREE⊢10⊣ |
| 1 1 0 | PE0⊢3⊢5⊢FREE⊢FREE⊢7⊢9⊣<br>PE1⊢2⊢4⊢8⊢8⊢10⊢10⊣ | PE0⊢3⊢4⊢8⊢7⊢8⊢FREE⊢FREE⊣<br>PE1⊢2⊢5⊢FREE⊢10⊢FREE⊢9⊢10⊣ |
| 1 1 1 | PE0⊢3⊢FREE⊢FREE⊢FREE⊣<br>PE1⊢FREE⊢6⊢8⊢10⊣ | PE0⊢3⊢8⊢FREE⊣<br>PE1⊢FREE⊢6⊢10⊣ |

| GATE NUMBER | #1 | #2 | #3 | #4 | #5 | #6 | #7 | #8 | #9 | #10 | TOTAL |
|---|---|---|---|---|---|---|---|---|---|---|---|
| EVENT NUMBER | 2 | 4 | 8 | 2 | 2 | 4 | 4 | 9 | 4 | 9 | 48 |

FIG.38(a)

| PROCESSOR NUMBER | 0 | 1 |
|---|---|---|
| EVENT NUMBER | 20 | 28 |
| GATE NUMBER (ALLOCATED GATE NUMBER) | 1, 3, 5, 7, 9 | 2, 4, 6, 8, 10 |

FIG.38(b)

| PROCESSOR NUMBER | 0 | 1 |
|---|---|---|
| EVENT NUMBER | 25 | 23 |
| GATE NUMBER (ALLOCATED GATE NUMBER) | 1, 3, 4, 7, 8 | 2, 5, 6, 9, 10 |

FIG.39

| INPUT PATTERN | GENERAL MODEL | MODEL OF THE PRESENT EMBODIMENT |
|---|---|---|
| 0 0 0 | PE0⊢1─┼─3─┼─5─┼FREE┼─7─┼─9─┤<br>PE1⊢2─┼FREE┼─4─┼─6─┼─8─┼─10─┤ | PE0⊢1─┼─3─┼─4─┼FREE┼─7─┼─8─┼FREE┼FREE┤<br>PE1⊢2─┼FREE┼─5─┼─6─┼FREE┼FREE┼─9─┼─10─┤ |
| 0 0 1 | PE0⊢3─┼FREE┼FREE┤<br>PE1⊢FREE┼─8─┼─10─┤ | PE0⊢3─┼FREE┼FREE┤<br>PE1⊢FREE┼─8─┼─10─┤ |
| 0 1 0 | PE0⊢3─┼FREE┼FREE┼FREE┼FREE┤<br>PE1⊢2─┼─4─┼─8─┼─10─┼─10─┤ | PE0⊢3─┼─4─┼─8─┼─8─┼FREE┤<br>PE1⊢2─┼FREE┼FREE┼─10─┼─10─┤ |
| 0 1 1 | PE0⊢3─┼FREE┼FREE┼─7─┼─9─┤<br>PE1⊢FREE┼─6─┼─8─┼─10─┼FREE┤ | PE0⊢3─┼─8─┼─7─┼FREE┤<br>PE1⊢FREE┼─6─┼─10─┼─9─┤ |
| 1 0 0 | PE0⊢1─┼─3─┼FREE┼FREE┼─7─┼─9─┤<br>PE1⊢2─┼FREE┼─6─┼─8─┼─10─┼FREE┤ | PE0⊢1─┼─3─┼─8─┼─7─┼FREE┤<br>PE1⊢2─┼FREE┼─6─┼─10─┼─9─┤ |
| 1 0 1 | PE0⊢3─┼FREE┼FREE┤<br>PE1⊢FREE┼─8─┼─10─┤ | PE0⊢3─┼─8─┼FREE┤<br>PE1⊢FREE┼FREE┼─10─┤ |
| 1 1 0 | PE0⊢3─┼─5─┼─7─┼─9─┤<br>PE1⊢2─┼─8─┼─10─┼FREE┤ | PE0⊢3─┼─8─┼─7─┼─7─┼─8─┤<br>PE1⊢2─┼─5─┼─10─┼─10─┼─10─┤ |
| 1 1 1 | PE0⊢3─┼FREE┼FREE┤<br>PE1⊢FREE┼─6─┼─8─┼─10─┤ | PE0⊢3─┼─8─┼FREE┤<br>PE1⊢FREE┼─6─┼─10─┤ |

LOGICAL SIMULATOR WITH EVENT LOAD MEASURING AND MODEL RECREATING UNITS FOR PARALLEL PROCESSING ELEMENTS

BACKGROUND OF THE INVENTION

1) Field of the Invention

The present invention relates to a logical simulator being a dedicated hardware which executes a high-speed logical simulation of a design result when logical circuits are designed. Particularly, the present invention relates to a device that performs a logical simulation by using a parallell-processing-type hardware formed of plural processing elements (hereinafter abbreviated to as PEs). The logical simulator models logically the design of digital devices such as computers and simulates the operation thereof. This logical simulation can confirm the operation of a digital device prior to manufacture and check for the correctness of the design.

2) Description of the Related Art

Recently, digital equipment such as digital computers which are formed of logical circuits have been large-scaled and complicated more and more.

The logical simulation has become increasingly important to check for the correctness of designing before manufacture of such digital equipment.

Since large-scaled digital equipment leads to an increase in time taken for the logical simulation, it has been demanded to check the logical simulation at high rate.

For such a demand, the parallel-processing-type logical simulation-only hardware (hereinafter, merely referred to as a parallel-processing-type hardware) has been developed to speed up the logical simulation of a large-scaled logical circuit. The high speed of the logical simulation can be realized by using the dedicated hardware.

A general logical simulation procedure will be explained by referring to the flowchart shown in FIG. 40 (steps S1 to S6).

First, the design data for a logic circuit being a candidate of a logical simulation is created (step S1). A logical simulation model is created according to the design data (logical data) (step S2). The logical simulation of the logic circuit is executed according to the logical simulation model. At this time one logical simulation execution file (such as an input pattern) previously created is selected. Then the logical simulation mode is executed according to the selected execution file (step S3).

It is judged whether the result of the logical simulation model is correct (step S4). If the result is erroneous, the design data created in the step S1 is modified (step S5). Then the flow goes back to the step S2. The process in the steps S2 to S5 is repeated till it is judged that the logical simulation result is correct in the step S4.

When it is judged that the result is correct in the step S4, it is judged whether there is another logical simulation execution file left (step S6). If yes, the flow goes back to the step S3. The process in the steps S3 to S6 is repeated until the completion of the logical simulation to all logical simulation execution file.

In order to improve the logical simulation speed of each PE forming a parallel-processing-type hardware, it is necessary to equalize the data throughput (load) to be executed by each PE. The technique that allocates the logical simulation model suitable to minimize a load bias to each PE has not yet been established. For that reason, the bias (imbalance) of load of each PE forming a parallel-processing-type hardware occurs. The situation occurs that other PEs are in process in spite of a completion of a PE. Then the synchronous waiting that stands by till the processes of all PEs are completed must be needed, thus deteriorating the parallel process efficiency.

Allocating the logical simulation model to each PE has been generally tried to minimize the load bias of each PE of a parallel-processing-type hardware according to the information of the logic circuit of a logical simulation model (for example, Japanese Laid-open Patent Publication (Tokkai-Syo) No. 61-224046 and (Tokkai-Hei) No. 3-288271). However, in such a technology, even when gates are allocated evenly in number to each PE, a partial circuit allocated to each PE does not operate uniformly. After all, the load to each PE is unevenly distributed at the logical simulation execution time, whereby the load bias of each PE cannot be effectively minimized.

Trial has been made to measure the load of a PE at the simulation execution time and to vary dynamically the load of each PE. For example, Japanese laid-open Patent Publication (Tokkai-Hei) No. 4-190460 discloses the technology which divides a circuit to be simulated into plural partial circuits, allocates the partial circuits to PEs respectively, shares the boundary portions between the partial circuits with the PEs, and processes only the shared partial circuit with a PE with a small load. Hence, in this technology, the load of each PE cannot be dynamically varied as a candidate of the whole circuit to be simulated. In contrast, the technology causes the trouble of increasing the scale of a circuit to be simulated by sharing a partial circuit with plural PEs.

As described above, according to the prior art, the logical simulation model is created without sufficiently considering the load bias of each PE forming the parallel-processing-type hardware. Hence, the parallel processing efficiency is reduced due to the synchronous waiting operation of each PE. This prior art is not sufficiently effective to the parallel process of the parallel-processing-type hardware.

SUMMARY OF THE INVENTION

The present invention is made to overcome the above mentioned problems. An object of the present invention is to provide a logical simulator that creates a logical simulation model which can evenly distributes the load to each PE in a parallel-processing-type hardware, suppresses certainly an increase in the parallel process efficiency due to the synchronous waiting operation of each PE, whereby a high-speed logical simulation can be realized by sufficiently unleashing the effect of the parallel process.

In order to achieve the above objects, according to the present invention, the logical simulator includes a parallel-processing-type hardware formed of plural PEs; a design data file for holding design data of a logic circuit to be logically simulated; a model creating unit for creating a logical simulation model according to the design data held in the design data file; a model file for holding a logical simulation model created with the model creating unit; a logical simulation executing unit for making each of the PEs in the parallel-processing-type hardware to execute the logical simulation according to the logical simulation model held in the model file; a load measuring unit for measuring the load of each of the PEs at a logical simulation execution time; and a load data file for holding as load data the result measured by the load measuring unit; the model creating unit creating a logical simulation model with a small load bias of each of the PEs at the logical simulation execution time, based on the measured result from the load measuring unit held in the load data file.

As described above, according to the logical simulator of the present invention, a load measuring unit measures the load of each of the PEs at a logical simulation execution time, and a logical simulation model with a small load bias of each of the PEs at the logical simulation execution time can be created based on the measured result. Hence the effect of the parallel process can be sufficiently obtained by surely suppressing a decrease in the parallel process efficiency due to the synchronous waiting operation of each PE. Thus the performance of the whole logical simulation system can be significantly improved by performing the logical simulation at a high speed.

BRIEF DESCRIPTION OF THE DRAWINGS

FIG. 15 is a diagram showing the event number occurred in each gate when the test pattern shown in FIG. 14 is input to the model shown in FIG. 13;

FIG. 16 is a diagram showing the event number occurred in each PE when the test pattern shown in FIG. 14 is input to the model shown in FIG. 13;

FIG. 23 is a diagram showing the content of a statistical data file updated and recreated by the event number data accumulating unit of the present embodiment, based on the statistical data shown in FIG. 21 and the event number data shown in FIG. 22;

FIG. 25 is a diagram showing an example of event number data measured at the logical simulation time of the design data shown in FIG. 24;

FIG. 27 is a diagram showing an example of statistical data obtained by accumulating the event number data measured when the design data shown in FIG. 24 is subjected to a logical simulation;

FIGS. 34(a) and 34(b) are diagrams each showing the gate allocation and the process event number for each PE, obtained by applying the general technique and the logical simulation model creating technique according to the present embodiment to the example shown in FIGS. 31 to 33;

FIG. 35 is a diagram showing the event process execution procedure (time taken for a logical simulation) of each PE to which gates are allocated as shown in FIGS. 34(a) and 34(b), for each input pattern by using gate numbers;

FIGS. 38(a) and 38(b) are diagrams each showing the gate allocation and process event number for each PE, obtained by applying to the example shown in FIGS. 36 and 37 the technique of the present embodiment which uses the general technique and logical simulation model being an analogous design model;

FIG. 39 is diagram showing the event process sequence procedure (time taken a logical simulation) of each PE to which gates shown in FIGS. 38(a) and 38(b) are allocated, every input pattern by using gate numbers.

Figure 1:
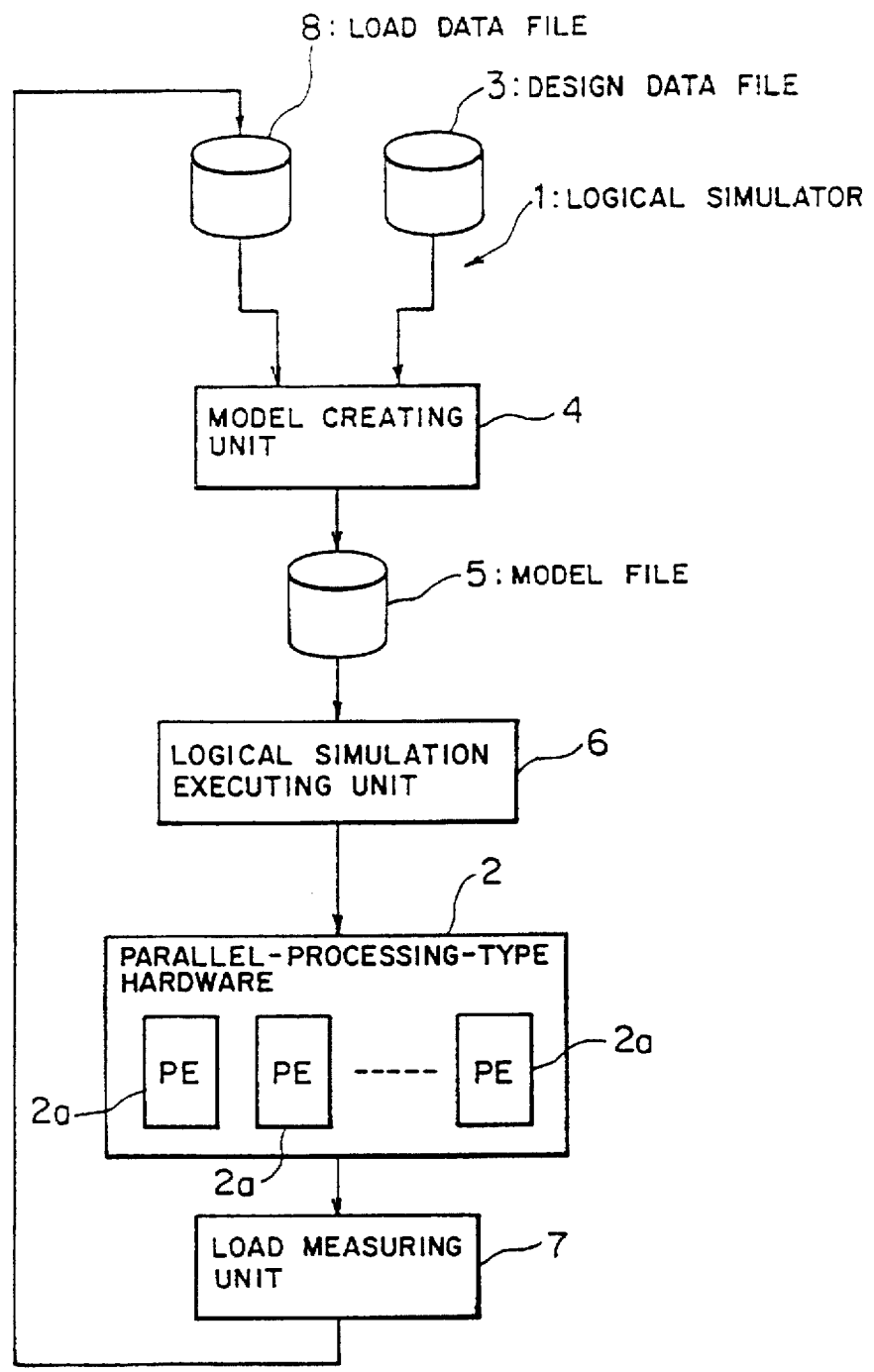
FIG. 1 is a block diagram showing an aspect of the present invention.

DESCRIPTION OF THE PREFERRED EMBODIMENTS (A) Aspect of the Invention:

FIG. 1 is a block diagram showing an aspect of the present invention. Referring to FIG. 1, the logical simulator 1 according to the present invention is formed of a parallel-processing-type hardware 2 formed of plural PEs 2a, a design data file 3 for holding design data of a logic circuit being a candidate of a logical simulation, a model creating unit 4 for creating a logical simulation model based on the design data held in the design data file 3, a model file 5 for holding the logical simulation model created by the model creating unit 4, and a logical simulation executing unit 6 for making each PE 2a in the parallel-processing-type hardware 2 to run the logical simulation according to the logical simulation model held in the model file 5.

In the logical simulator 1 according to the present invention, the parallel-processing-type hardware 2 includes a load measuring unit 7 for measuring the load of each processing unit 2a at the logical simulation execution time and a load data file 8 as load data for holding the measured result measured by the load measuring unit 7. The model creating unit 4 creates a logical simulation model with a small load bias of each PE2a at the logical simulation execution time, based on the measured result of the load measuring unit 7.

The parallel-processing-type hardware 2 may include a model recreating unit that recreates a logical simulation model with a small load bias of each PE2a at the logical simulation execution time, based on the logical simulation model held in the model file 5 and the result measured by the load measuring unit 7.

The load measuring unit 7 may measure the event number in an event drive mode which is handled as load data of each PE2a. In this case, the load measuring unit 7 may measure the event number in a predetermined time slot during a logical simulation period decided by the parallel-processing-type hardware 2.

Moreover, the parallel-processing-type hardware 2 may include a data accumulating unit for accumulating and analyzing the event number which is measured by the load measuring unit 7 at the logical simulation execution time and held in the load data file 8, and a statistical data file for holding statistical data created by the data accumulating unit.

In this case, the data accumulating unit may recreate the statistical data, based on the event number held in the load data file 8 and the existing statistical data held in the statistical data file, after the logical simulation of the design data created for statistical data has been performed.

The model creating unit 4 may be formed such that the logical simulation model with a small load bias of each PE2a is created at the logical simulation execution time, based on the event number held in the load data file 8 and the design data held in the design data file 3. The model recreating unit may be formed such that the logical simulation model with a small load bias of each PE2a is created at the logical simulation execution time, based on the event number held in the load data file 8 and the logical simulation model held in the model file 5.

Where the data accumulating unit is arranged, the model creating unit 4 may be formed such that the logical simulation model with a small load bias of each PE2a is created at the logical simulation execution time, based on the statistical data held in the statistical data file and the design data held in the design data file. The model recreating unit may be formed such that the logical simulation model with a small load bias of each PE2a is created at the logical simulation execution time, based on the statistical data held in the statistical data file and the logical simulation model held in the model file 5.

In the logical simulation device 1 with the above described configuration according to the present invention, the load measuring unit 7 measures the load (e.g. the event number in the event drive mode) of each PE2a at the logical simulation execution time. The measured result is stored as load data into the load data file 8. At the same time, the model creating unit 3 reflects the logical simulation model held in the model file 5. That is, a logical simulation model with a small load bias of each PE2a at the logical simulation time is created.

In a logical simulation of new design data, when the logical simulation model is created on design data similar to the new design data and then stored in a model file, the logical simulation executing unit 6 can execute a logical simulation by using the logical simulation model regarding the similar design data. From the beginning, the load can be equally distributed to each PE2a in the parallel-processing-type hardware 2.

Even when new design data is subjected to a logical simulation by creating a new logical simulation model, the design data may be corrected to remove an error in the simulation result. In this case, since the model creating unit 4 reflects the result measured by the load measuring unit 7 to the new logical simulation model at the logical simulation execution time the error occurs, the load can be equally distributed to each PE2a in the parallel-processing-type hardware 2 after the second logical simulation.

The model recreating unit reflects the result measured by the load measuring unit 7 to the logical simulation model held in the model file 5 and can further reduce the load bias of each PE2a at the next logical simulation executing time.

Moreover, by holding the statistical data regarding the event number (the result measured by the load measuring unit 7) created or recreated by the data accumulating unit 6 in the statistical data file and then using the statistical data for the creation or recreation of a logical simulation model issued from the model creating unit 4 or the model recreating unit, the statistical data is reflected to the logical simulation model while handling statistically the previously-measured event number. Hence, the load bias of each PE2a can be reduced at the next logical simulation time.

During a substantial logical simulation period (or a period desired by a user) except a predetermined period after the beginning of a simulation or before the completion of a simulation, only the event number can be measured by previously designating the event number measured time slot.

As above-described in detail, according to the logical simulator 1 of the present invention, the load measuring unit 7 measures the load of each PE2a at the logical simulation execution time. Since the logical simulation model with a small load bias of each PE2a at the logical simulation execution time can be created according to the measured result, a decrease in the parallel process efficiency due to the synchronous wait of each PE PE2a can be suppressed certainly and the effect of the parallel process can be obtained sufficiently. Hence, there is the advantage in that the performance of the whole logical simulation system can be significantly realized by speeding up the logical simulation.

The model recreating unit can reflect the result measured by the load measuring unit 7 to the logical simulation model.

Hence, the load bias of each PE2a can be further reduced at the next logical simulation execution time. This feature contributes to speeding up the logical simulation.

Furthermore, the measured result can be reflected to the logical simulation model by using the statistical data of the event number for the creation or recreation of the logical simulation model while handling the previously-measured event number. Hence, the load bias of each PE2a at the next logical simulation execution time can be further reduced. This feature contributes to further speeding up the logical simulation.

During, for example, the substantial logical simulation period (or a period desired by a user) except a predetermined period after the beginning of a simulation or before a completion of a simulation, only event number can be measured by previously designating the measuring time slot of the event number. Hence, the load can be effectively measured while the logical simulation model can be effectively created or recreated.

Figure 2:
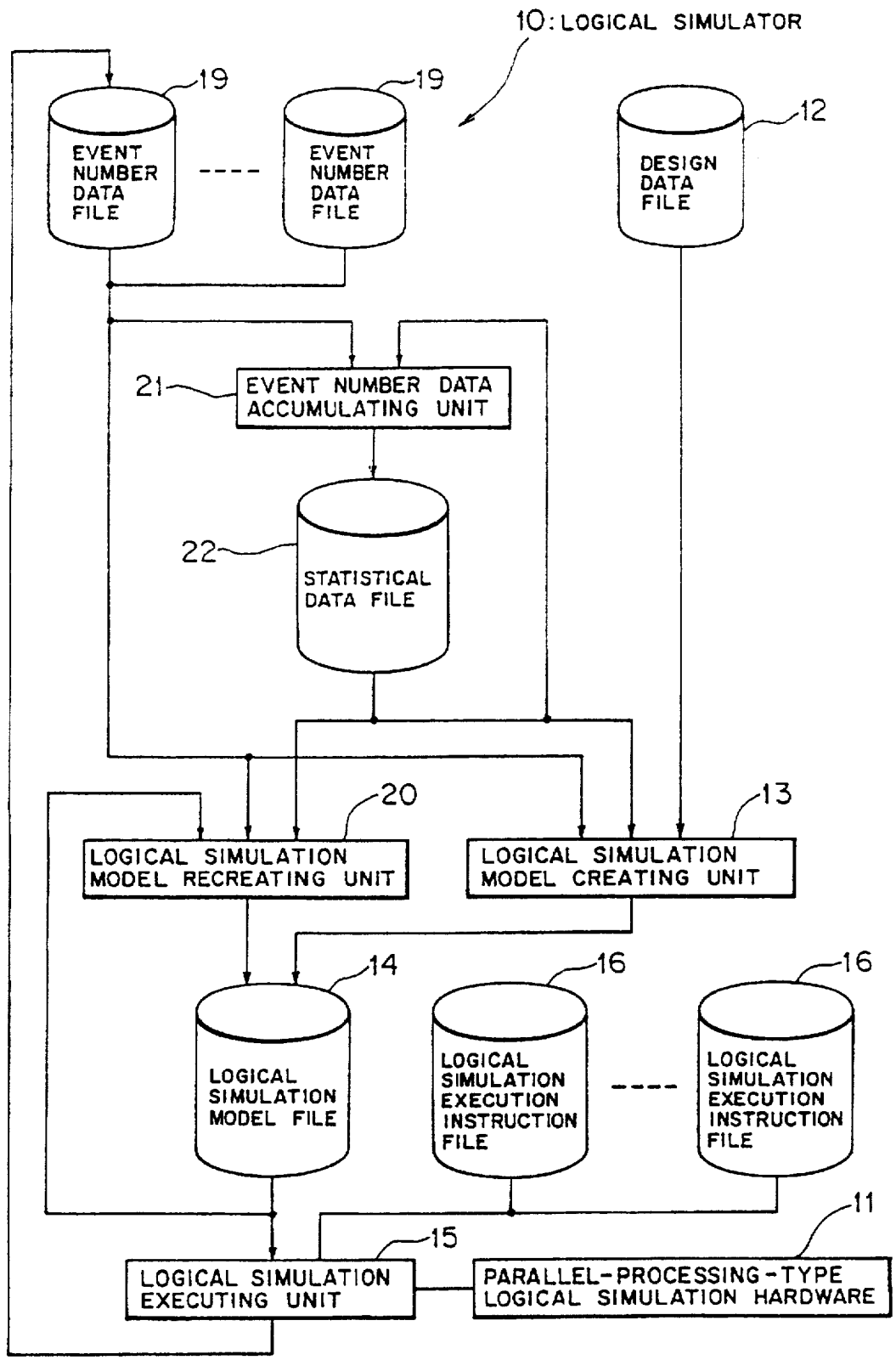
FIG. 2 is a block diagram showing the whole configuration of a logical simulator according to an embodiment of the present invention.

(B) An Embodiment of the Present Invention:

An embodiment of the present invention will be described below by referring to the attached drawings. (B-1) The Whole Configuration of the Logical Simulator of the Embodiment:

FIG. 2 is a block diagram illustrating the whole configuration of a logical simulator according to the present invention. As shown in FIG. 2, the logical simulator according to the present embodiment consists of a parallel-processing-type logical simulation hardware 11, a design data file 12, a logical simulation model creating unit 13, a logical simulation model file 14, a logical simulation executing unit 15, a logical simulation execution file 16, an event number data file 19, a logical simulation model recreating unit 20, an event number data accumulating unit 21, and a statistical data file 22.

Figure 3:
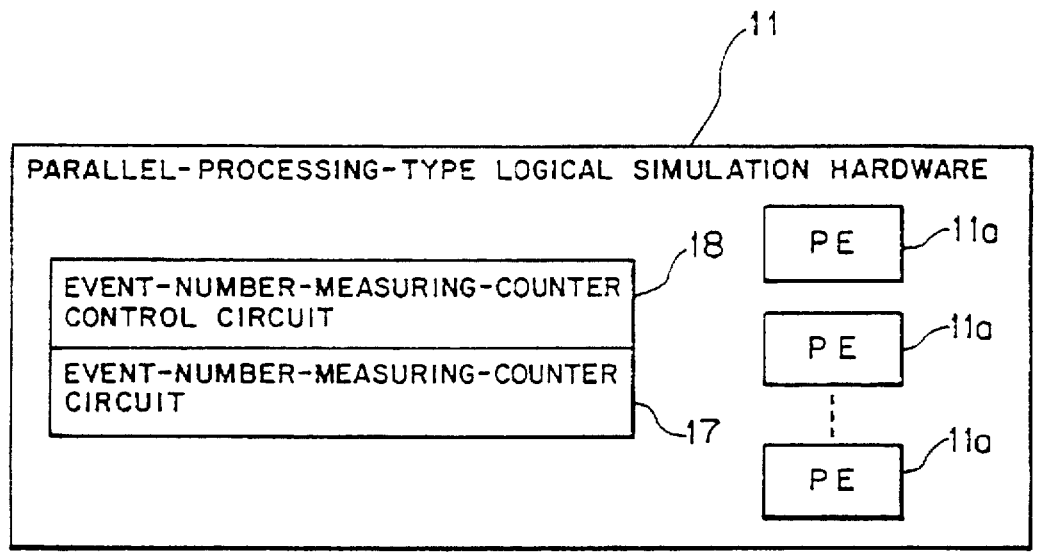
FIG. 3 is a block diagram showing the hardware configuration for a parallel-processing-type logical simulation according to the present embodiment.

According to the present embodiment, the parallel-processing-type hardware (hereinafter, merely referred to as a hardware) 11, as shown in FIG. 3, includes an event number measuring counter (load measuring unit) 17, an event number measuring counter control circuit 18, and plural PEs2a.

The event number measuring counter 17 is operationally controlled by the counter control circuit 18 and counts the event number in the event drive mode as an index of the load of each PE11a at a logical simulation execution time.

The counter control circuit 18 has the function of selecting a given accumulating object such as PE unit and gate unit (the minimum unit processed in the logical simulation) as an event number accumulating object every time when each logical simulation is executed. As described later with FIGS. 5(a) to 5(c), the counter control circuit 18 has the function of counting the event number at a previously-designated time slot out of the logical simulation period in the hardware 11 by means of the counter 17.

That is, the counter control circuit 18 indicates the counter 17 to designate a given count start time and a given count end time, a given count start time and a given period (time interval), or a given count end time and a given period (time interval) during a logical simulation execution time slot. Thus the counter control circuit 18 can count the event number at a selected given time slot by means of the cunter 17.

The design data file 12 holds design data for a logical circuit being an object for a logical simulation (refer to FIGS. 6, 13, 24, and 31).

The logical simulation model creating unit 13 (hereinafter, merely referred to as a model creating unit) creates a logical simulation model based on the design data held in the design data file 12. According to the present embodiment, the logical simulation model creating unit 13, as described later, creates a logical simulation model with a small bias of a load (the event number to be processed) of each PE11a at a logical simulation execution time based on the result (event number data or statistical data thereof) measured by the counter 17.

The logical simulation model file 14 (hereinafter, merely referred to as a model file) holds a logical simulation model created in the model creating unit 13 and the logical simulation model recreated in the model recreating unit 20 (to be described later).

The logical simulation executing unit 15 makes each PE PE11a in the hardware 11 to execute the logical simulation following the logical simulation model held in the model file 14, based on the execution file 16 for each logical simulation. The logical simulation execution file 16 holds, for example, the input pattern shown in FIGS. 14 and 32. In response to the event number data counted by the counter 17 in the hardware 11, the logical simulation executing unit 15 creates the event number data file 19 (a load data file: refer to FIGS. 19, 20, 22, and 25) holding the event number data.

The logical simulation model recreating unit (hereinafter, merely referred to as a model recreating unit) 20, as described later, recreates a logical simulation model with a small bias of a load (the event number to be processed) of each PE11a at the logical simulation execution time, based on the logical simulation model held in the model file 14 and the result measured by the counter 17, and then stores it in the model file 14.

Moreover, the event number data accumulating unit (hereinafter, merely referred to as a data accumulating unit) 21, as described later with FIG. 17, creates the statistical data (refer to FIG. 21) by accumulating and analyzing the event number which is measured by the counter 17 at the logical simulation execution time and then held in the event number data file 19, and then stores it to the statistical data file 22.

After a logical simulation is executed for the design data with statistical data already-created, the data accumulating unit 21, as described later with FIG. 18, recreates the statistical data (refer to FIG. 23) based on the event number held in the event number data file 19 and the executing statistical data held in the statistical data file 22 and then stores it in the statistical data file 22.

Since the logical simulation is generally carried out with plural logical simulation execution files 16 prepared for one logical simulation model, plural event number data files 19 are created. In the present embodiment, the plural event number data files 19 are collected as one statistical data file 22 by accumulating and analyzing contents (event number data) held in the plural event number data files 19 by means of the data accumulating unit 21. Collecting one statistical data file 22 facilitates the process in the model creating unit 13 and the model recreating unit 20.

When creating a logical simulation mode, the model creating unit 13 receives the design data held in the design data file 12 and the event number data held in a desired number of the event number data files 19. The design data includes design data. As described later with FIGS. 19, 20, 22 and 25, each event number data file 19 includes information regarding the event number counted by each partial circuit (PE unit and gate unit) in a logical simulation object circuit.

The model creating unit 13 creates a logical simulation model with a small bias of a load (the event number to be processed) of each PE11a using the data and evaluation functions (to be described later).

In the same manner, when creating a logical simulation mode, the model creating unit 13 receives design data held in the design data file 12 and statistical data held in the statistical data file 22. The design data includes design logical data. The statistical data file 22, as described later in FIGS. 21 and 23, includes statistical information (such as average values) regarding the event number counted by each partial circuit (PE unit and gate unit) in the logical simulation object circuit.

The model creating unit 13 creates a logical simulation model using the data and the evaluation function (to be described later) to reduce the bias of a load (the event number of to be processed) of each PE11a.

When recreating a logical simulation model, the model recreating unit 20 receives the logical simulation model held in the model file 14 as well as the event number data held in the a desired number of event number data files 19. The logical simulation model includes design logical data. Each event number data file 19 includes information regarding the event number (as described above). The model recreating unit 20 recreates a logical simulation model by using the pieces of data and the evaluation function (to be described) to reduce the bias of a load (the event number to be processed) of each PE11a (refer to FIG. 29).

Similarly, when recreating a logical simulation model, the model creating unit 13 may receive a logical simulation model held in the model file 14 and statistical data held in the statistical data file 22. The logical simulation model includes design logical data. The statistical data file 22 includes statistical information (such as an average value) regarding the event number (as described above). Using the data and the evaluation function (to be described), the model recreating unit 20 recreates the logical simulation model to reduce the bias of the load (the number to be processed) of each PE11a (refer to FIG. 30).

Figure 4:
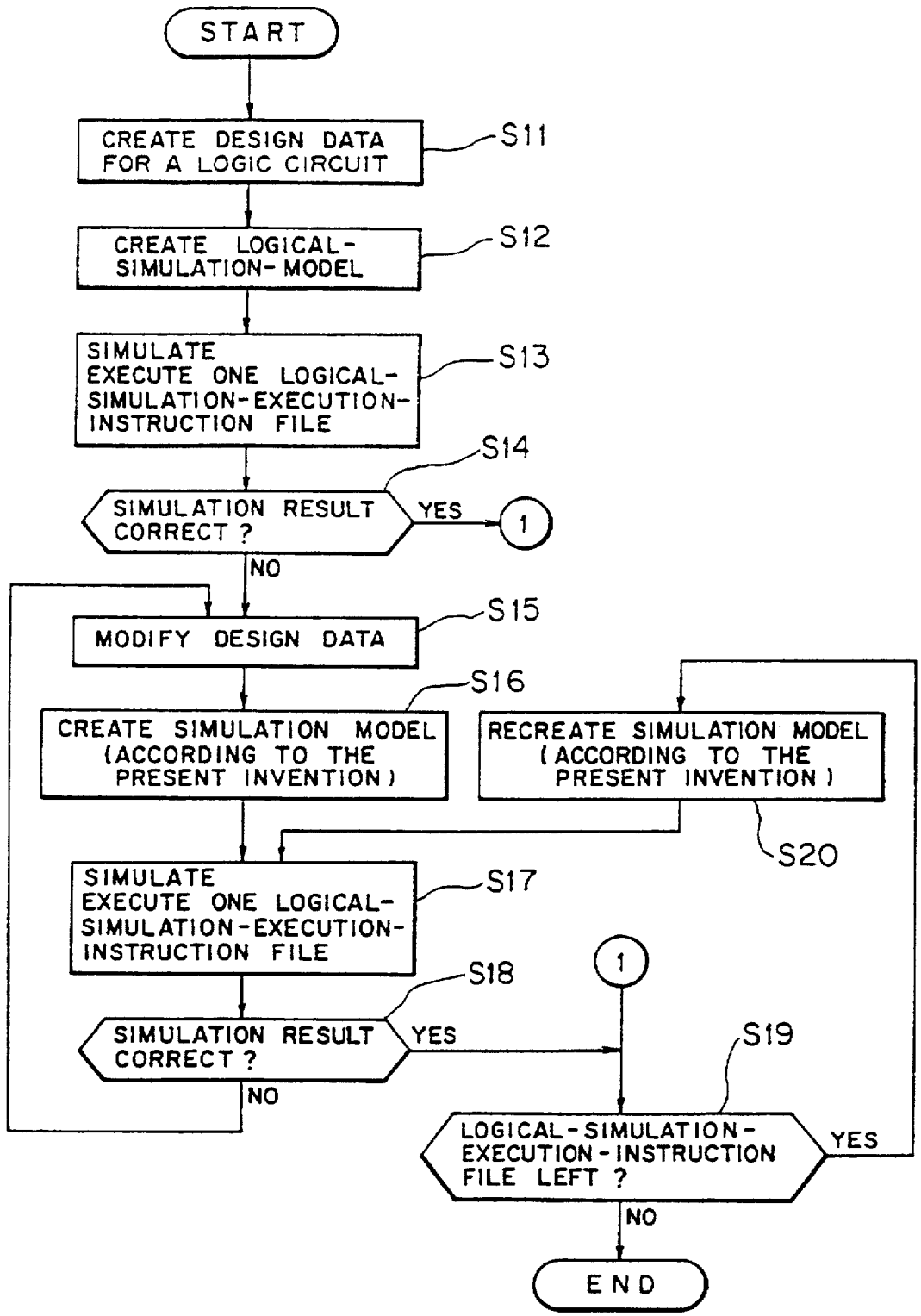
FIG. 4 is a flowchart used for explaining the whole operation (process flow) of a logical simulator according to the present embodiment.

(B-2) The Entire Operation of the Logical Simulator According to Present Embodiment:

Next, the whole operation (process flow) of the logical simulator 10 according to the present embodiment will be explained according to the flowchart (steps S11 to S20) shown in FIG. 4.

First, design data for a logical circuit being an object for a logical simulation is created (step S11). Then a logical simulation model is created according to the design data (logical data) (step S12).

If a logical simulation model created regarding design data similar to new design data being an object for the logical simulation has been already stored in the file, the model creating unit 13 creates a logical simulation model by using the logical simulation model regarding the similar design data.

When a logical simulation model regarding the similar design data exists, the load to each PE11a can be equally distributed from the first to some extent by creating the logical simulation model. When the logical simulation model regarding the similar design data exists, the concrete function and effect will be described later by referring to FIGS. 31 to 39.

When there is no logical simulation model regarding the similar design data, a logical simulation model is created by using a general technique (e.g. a method of mechanically dividing the event process of each gate into PEs11a according to the gate number of design data (to be described later in FIG. 34(b)).

The logical simulation executing unit 15 selects one of logical simulation execution files (such as input patterns) 16 previously prepared by applying the logical simulation model prepared in the step S12 to the hardware 11 and then makes each PE11a to execute the logical simulation based on the file (step S13).

When the logical simulation is executed in the step S13, the counter 17 counts the event number produced in each PE11a and the event number data file 19 holds the count result as load data through the logical simulation executing unit 15. At this time, as described later in FIGS. 5(a) to 5(c), the counter control circuit 18 designates the count time slot of the event number counted by the counter 17.

When the result after the logical simulation in the step S13 is wrong (in the case of NO decision in the step S14), the design data created in the step S11 is corrected (step S15). Then as to the post correction design data, the model creating unit 13 creates a logical simulation model with a small load bias of each PE11a at the logical simulation execution time, based on the design data corrected in the step S15 and the result measured by the counter 17 by the current time (the content of the event number data file 19 and the content of the statistical data file 22) (step S16).

In the process of the step S16, the results (event number data and statistical data thereof) measured by the counter 17 are reflected to the logical simulation model held in the model file 14.

Hence, even when a new logical simulation model is created in the step S12 to execute it, if the design data may be corrected because of an error in the simulation result (NO decision in the step S14), the result measured by the counter 17 at the execution time of an error-occurring logical simulation is reflected to a new logical simulation model by means of the model creating unit 13 (step S16). As a result, the load to each PE11a can be evenly distributed in the logical simulations after the second logical simulation (step S17).

Thereafter, in the same manner as that in the step S13, the logical simulation executing unit 15 applies the logical simulation model created in the step S16 to the hardware 11 and selects one of the logical simulation execution files 16 previously prepared, and then executes the logical simulation of each PE11a according to the file (step S17).

In order to execute a logical simulation in the step S17, the counter 17 counts the event number occurring in each PE11a and then holds the count result as load data into the event number data file 19 via the logical simulation executing unit 15.

When the logical simulation in the step S17 is erroneous (NO decision in the step S18), the flow goes back to the step S15.

Then the above-mentioned process in the steps S15 to S18 is repeated till it is judged that the logical simulation result is correct in the step S18.

When it is judged that the logical simulation result is correct in the steps S14 or S18 (YES decision), it is judged whether other logical simulation execution files 16 are left (step S19).

When the execution file 16 is left (YES decision), the model recreating unit 20 recreates a logical simulation model with a small load bias of each PE11a at the logical simulation execution time, based on the logical simulation model held in the model file 14 and the result measured by the counter 17 by a current time (the content of the event number data file 19 and the content of the statistical data file 22) (step S20).

In the process in the step S20, the result measured by the counter 17 is reflected to the logical simulation model in the model file 14. As a result, the load bias of each PE11a can be reduced at the next logical simulation execution time.

Thereafter, the flow goes back to the step S17. The steps S15 to S18 are repeated till it is judged that the logical simulation result in the step S18 is correct.

The steps S15 to S20 are repeated till it is judged that no logical simulation execution file 16 is left in the step S19 (NO decision), that is, till all the logical simulation execution files 16 complete the logical simulation. When NO decision is done in the step S19, the logical simulator 10 according to the present embodiment completes the logical simulation regarding the design data of the current logical circuit.

(B-3) Effect of Logical Simulator of Present Embodiment:

According to the logical simulator 10 being an embodiment of the present invention, the counter 17 measures the event number as a load of each PE11a at the logical simulation execution time. Then a logical simulation model with a small load bias of each PE11a at the logical simulation execution time can be created based on the measured result (event number data or statistical data).

Hence, a decrease in the parallel process efficiency due to a synchronous waiting operation of each PE11a can be suppressed. The performance of the whole logical simulation system can be greatly improved by speeding up the logical simulation.

The model recreating unit 20 can reflect the result measured by the counter 17 to the logical simulation model.

The load bias of each PE11a can be reduced at the next logical simulation execution time. This feature contributes to speeding up the logical simulation.

The data accumulating unit 21 holds the statistical data regarding the created or recreated event number into the statistical data file 22 while the model creating unit 13 is used to create the logical simulation model according to the statistical data or the model recreating unit 20 is used to recreate the logical simulation model according to the statistical data. Thus, since the event number measured in past is handled statistically while being reflected to the logical simulation model, the load bias of each PE11a can be reduced at the next logical simulation time. This feature contributes to a higher speed operation of the logical simulation.

(B-4) Various Portions of the Logical Simulator of the Invention:

The concrete function and effect of various portions in the logical simulator 10 according to the embodiment described with FIGS. 2 to 4 will be explained in detail by referring to FIGS. 5 to 30.

Figure 5A:
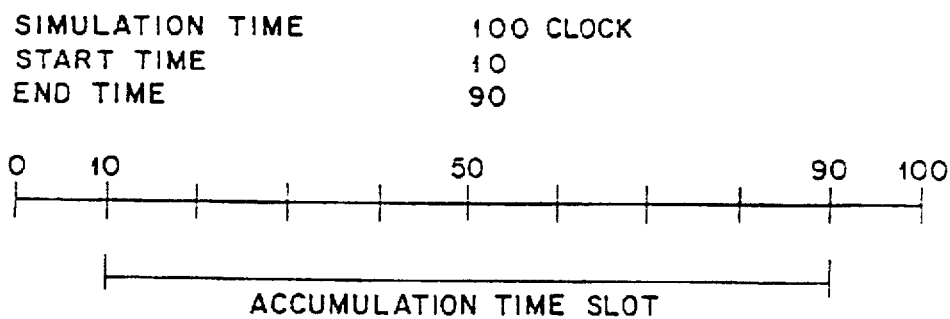
FIGS. 5(a) to 5(c) are diagrams each used for explaining an example of designating the time slot for accumulating event number data according to the present embodiment.
Figure 5B:
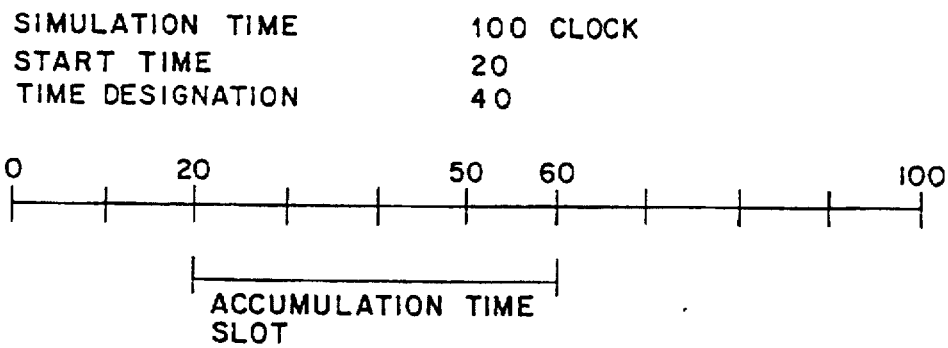
Figure 5C:
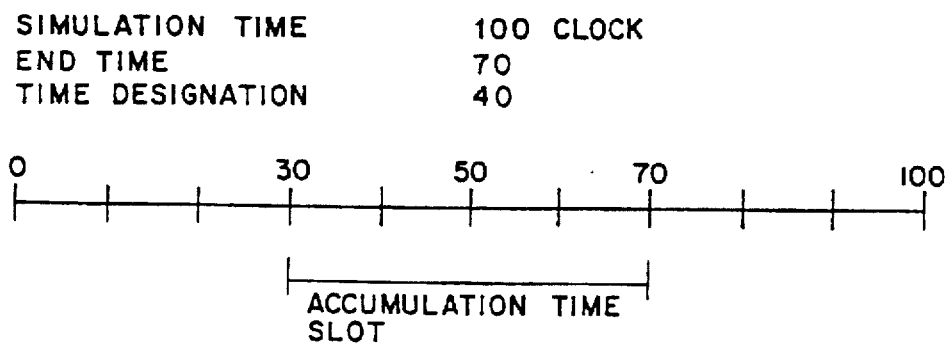

(B-4-1) Example of Designating the Event Number Data Accumulating Time Slot:

FIGS. 5(a) to 5(c) are used to explain the example of the event number data accumulating time slot (the count time slot of the counter 17) designated by the counter control circuit 18 according to the present embodiment.

FIG. 5(a) illustrates the example that the counter control circuit 18 designates the count start time 10 and the count end time 90 during the logical simulation execution time slot (100 clocks). In the example shown in FIG. 5(a), the event number in the time slot corresponding to 80 clocks ranging from the count start time 10 to the count end time 90 (the event number counted by the counter 17) is accumulated.

FIG. 5(b) illustrates the example that the counter control circuit 18 designates the count start time 20 and the time interval 40 in the logical simulation execution time slot (100 clocks). In the example shown in FIG. 5(b), the event number in the time slot corresponding to 40 clocks ranging from the count start time 20 to the count end time 60 (the event number counted by the counter 17) is accumulated.

FIG. 5(c) illustrates an example of designating the count end time 70 and the time interval 40 during the logical simulation execution time slot (100 clocks). In the example shown in FIG. 5(c), the event number in the time slot corresponding to 40 clocks ranging from the time 30 to the count end time 70 (the event number counted by the counter 17) is accumulated.

As described above, the event number only in the period (or period desired by a user) during which the logical simulation is being substantially performed, except a predetermined period after a logical simulation start time or before a logical simulation end time, can be measured by previously designating the count time slot by means of the counter 17. Hence, the event number can be effectively counted while the logical simulation model can be created or recreated effectively.

(B-4-2) Logical Simulation Time due to Gate Allocation to Each Processing Element:

The theory that the model creating unit 13 or the model recreating unit 20 of the present embodiment creates (or recreates) a logical simulation model with a small load bias of each PE PE11a at the logical simulation execution time will be explained below with reference to FIGS. 6 to 12.

Figure 6:
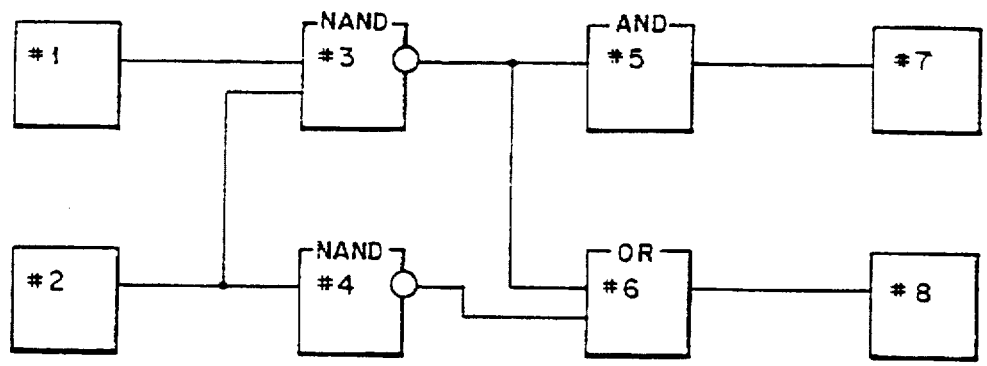
FIG. 6 is a diagram showing an example of design data.

FIG. 6, for example, shows the example of design data of a logical circuit being an object of a logical simulation. In FIG. 6, each block represents a gate (the minimum unit processed in a logical simulation). The gate numbers #1 to #8 marked in the block specify gates respectively. #1 and #2 represent input gates. #3 represents a 2-input NAND gate. #4 represents an 1-input NAND gate. #5 represents an 1-input AND gate. #6 represents a 2-input OR gate. #7 and #8 represent output gates.

Figure 7:
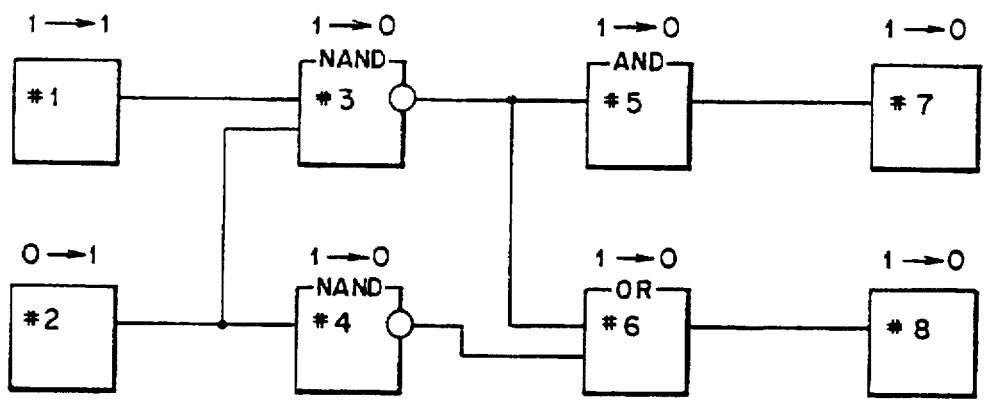
FIG. 7 is a diagram showing an example of a logical simulation of the design data shown in FIG. 6.

FIG. 7 shows the example of a logical simulation for the design data shown in FIG. 6. In FIG. 7, the numeral over each of the gates #1 to #8 shows a change in the output logical value. The left side of the arrow shows a logical value before change while the right side of the arrow shows a logical value after change. FIG. 7, for example, shows changes in all the gates #1 to #8 when the input logical value to the gate #2 changes from "1" to "0" while the input logical value of the gate #1 remains "1". The logical simulation method is an event drive method and a single delay method.

Figure 8:
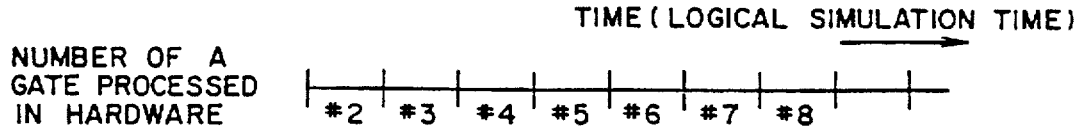
FIG. 8 is a diagram showing the event process sequence order (time taken by a logical simulation) of the case where a sole PE executes the logical simulation shown in FIG. 7, using gate numbers.

Referring to FIG. 8, #2 to #8 show the event process execution sequence when the logical simulation shown in FIG. 7 is performed using a sole PE11a. In the example shown in FIG. 7, the event process execution procedures of the gates #2 to #8 are shown because no logical value changes in the gate #1.

On the other hand, it is assumed that a logical simulation model is created by allocating the design data, for example, shown in FIG. 6 to two PEs11a shown in FIG. 9 (hereinafter, represented as PE0 and PE1; 0 and 1 represent processor numbers in a PE respectively). That is, when the event process of each of the gates #1, #3, #5 and #7 is allocated to the PE0, the event process execution procedure of the PE0 is shown in FIG. 10(a). When the event process of each of the gates #2, #4, #6 and #8 is allocated to the PE1, the event process execution procedure of the PE1 is shown in FIG. 10(b).

Figure 9:
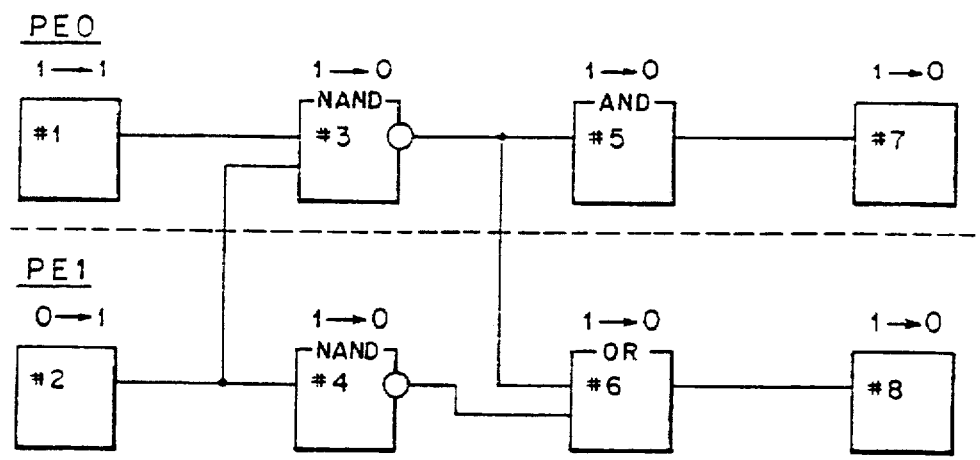
FIG. 9 is a diagram showing an example (a logical simulation model example) of the design data shown in FIG. 6 allocated to a parallel-processing-type hardware.
Figure 10A:
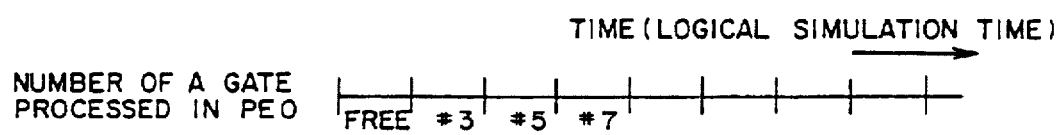
FIGS. 10(a) and 10(b) are diagrams each showing the event process sequence order of each PE allocated with the gate shown in FIG. 9, using gate numbers.
Figure 10B:
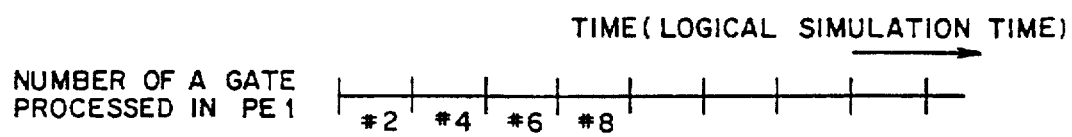

As shown in FIGS. 10(a) and 10(b), the logical simulation model shown in FIG. 9 can complete the logical simulation in 4/7 (4 clocks) of the execution time of the sole PE11a shown in FIG. 8.

Now, it is assumed that the logical simulation model in which the design data shown in FIG. 6 is allocated to two PEs 0 and 1 is created. That is, when the event process of each of the gates #1, #3, and #5 to #8 is allocated to the PE0 and the event process of each of the gates #2 and #4 is allocated to the PE0, the event process execution procedure in the PE0 is shown in FIG. 12(a) and the event process execution procedure in the PE1 is shown in FIG. 12(b).

Figure 11:
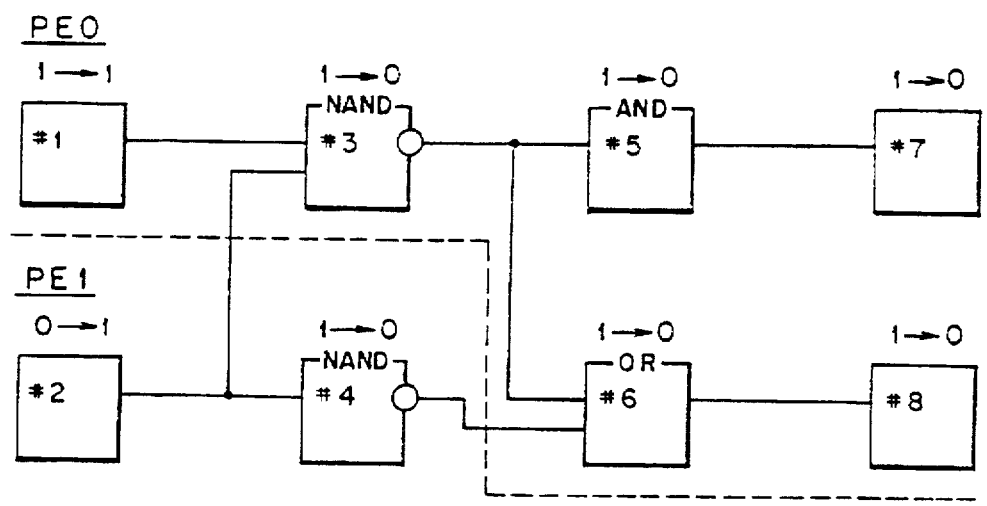
FIG. 11 is a diagram showing an example (a logical simulation model example) of the design data shown in FIG. 6 allocated to another parallel-processing-type hardware.
Figure 12A:
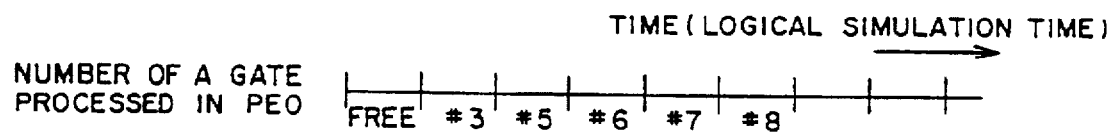
FIGS. 12(a) and 12(b) are diagrams each showing the event process sequence order of each PE allocated with the gate shown in FIG. 11, using gate numbers.
Figure 12B:
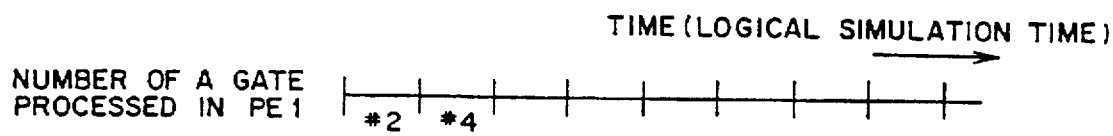

As shown in FIGS. 12(a) and 12(b), the logical simulation model shown in FIG. 11 can complete the logical simulation in 6/7 (6 clocks) of the execution time of the sole PE PE11a shown in FIG. 8. However, the simulation time is longer than that in the logical simulation model shown in FIG. 9.

As clear in the comparison of FIGS. 10(a) and 10(b) and FIGS. 12(a) and 12(b), even when the same test pattern (a change in input logical value of each of the input gates #1 and #2) is provided to an object (design data for a logical circuit) applied to the same logical simulation, the logical simulation time depends on how the gates #1 to #8 are allocated to the PE0 and PE1.

Hence, when the model creating unit 13 creates a logical simulation model with a small bias of the load (the event number to be processed) of each PE11a at the logical simulation execution time, based on the result (the event number data or statistical data) measured by the counter 17, or the model recreating unit 20 recreates a logical simulation model with a small bias of the load (the event number to be processed) of each PE11a at the logical simulation execution time, based on the result (the event number data or statistical data) measured by the counter 17, it is needed to consider somewhat how the gate to be subjected to an event process is allocated to each PE11a.

Figures 13, 14:
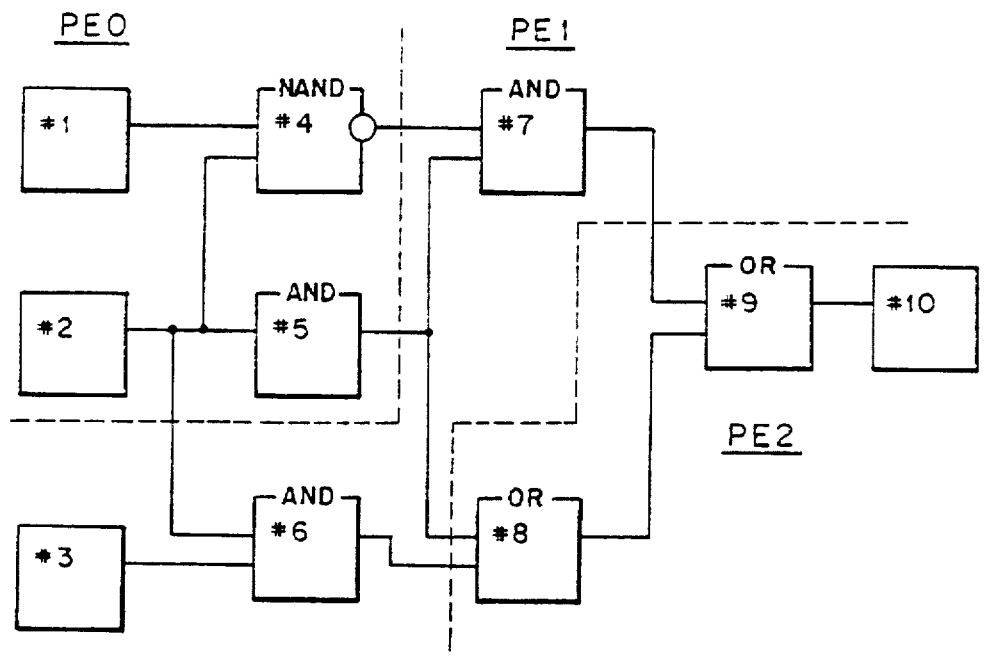
FIG. 13 is a diagram showing another design data example and an example allocated to a parallel-processing-type hardware thereof (a logical simulation model example)
FIG. 14 is a diagram showing a test pattern (input pattern) used when the design data shown in FIG. 13 is subjected to a logical simulation.

(B-4-3) Concrete Result Measured by the Counter 17 of the Present Embodiment:

Next, in order to perform a logical simulation according to the design data shown in FIG. 13, when the test pattern (input pattern) shown in FIG. 14 is input to the logical simulation model (input gates #1 to #3), the concrete example of the event number (that is, the event number actually produced) counted by the counter 17 is shown in FIGS. 15 and 16.

In the same manner as that shown in FIG. 6, each block in FIG. 13 shows a gate. The gates number #1 to #10 marked in blocks represent gates respectively. Referring to FIG. 13, #1 to #3 represent input gates. #4 represents a 2-input NAND gate. #5 represents a 1-input AND gate. #6 and #7 represent 2-input AND gates. #8 represents a 2-input OR gate. #9 represents a 2-input OR gate. #10 represents an output gate.

Now, it is assumed that the logical simulation model in which the design data shown in FIG. 13 is allocated to three PEs11a (hereinafter, represented by the PE0, PE1 and PE2; 0 to 2 represent processor numbers in PEs) is created. That is, the event process of each of the gates #1, #2, #4 and #5 is allocated to the PE0. The event process of each of the gates #3, #6, and #7 is allocated to the PE1. The event process of each of the gates #8, #9 and #10 is allocated to the PE2.

The event number issued from each of the gates #1 to #10 is shown in FIG. 15. The event number issued from each of the PE0, PE1 and PE2 is shown in FIG. 16. In the present embodiment, the counter 17 counts the event number. Then the logical simulation executing unit 15 stores the result as event number data into the file 19.

Figure 17:
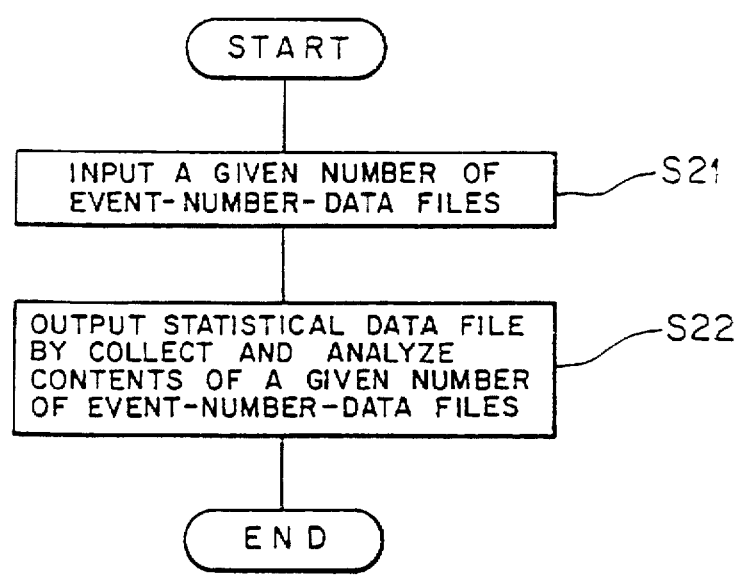
FIG. 17 is a flowchart used for explaining the process procedure in the event number data accumulating unit according to the present embodiment (new statistical data creating procedure)
Figure 18:
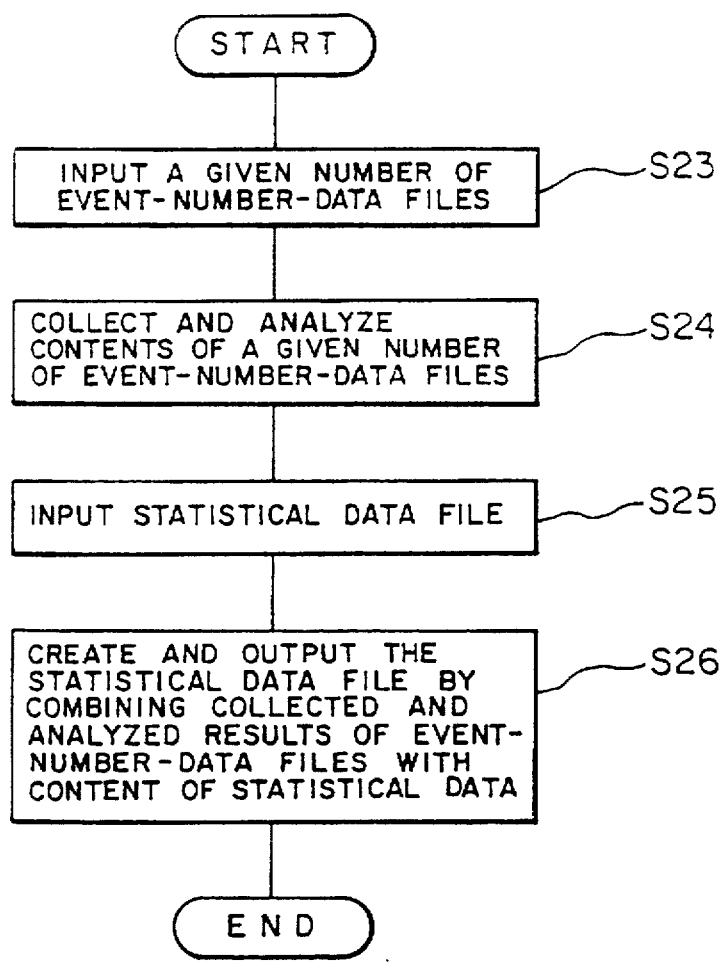
FIG. 18 is a flowchart used for explaining the process procedure in the event number data accumulating unit according to the present embodiment (statistical data updating and recreating procedure)

(B-4-4) Processing Procedure of the Event Number Data Accumulating Unit 21 of the Present Embodiment:

The event number data accumulating unit 21 of the present embodiment shown in FIG. 2 creates newly statistical data according to the process procedure shown in FIG. 17 and further recreates (updates) the statistical data already created using the process procedure shown in FIG. 18.

First, let us explain the new statistical data creating procedure of the event number data accumulating unit 21 according to the flowchart (steps S21 and S22) shown in FIG. 17. The event number data accumulating unit 21 inputs the result counted by the counter 17 to a given number of event number data files 19 (step S21), accumulates and analyzes the contents of the files 19, and then issues the created statistical data (e.g. the average value shown in FIG. 21) as the statistical data file 22 (step S22).

The statistical data updating and recreating procedure which is executed by the event number data accumulating unit 21 after a logical simulation is performed according to the design data of the existing statistical data created will be explained according to the flowchart shown in FIG. 18 (steps S23 to S26).

In this case, the event number accumulating unit 21 receives a given number of event number data files 19 holding the result counted by the counter 17 (step S23) and then accumulates and analyzes the contents of the files 19 (step S24). Then the event number accumulating unit 21 receives the statistical data file 22 holding the statistical data already created (step S25), recreates the statistical data (e.g. the average value shown in FIG. 23) based on the event number holding the event number data file 19 and the existing statistical data holding in the statistical data file 22, and then outputs the outcome as the statistical data file 22 (step S26).

(B-4-5) Concrete Statistical Data Created by the Event Number Data Accumulating Unit 21 of the Present Embodiment:

Next, the concrete statistical data (the accumulated result of event number data) created by the event number data accumulating unit 21 which operates as described with FIGS. 17 and 18 will be explained below by referring to FIGS. 19 to 23.

Figure 19:
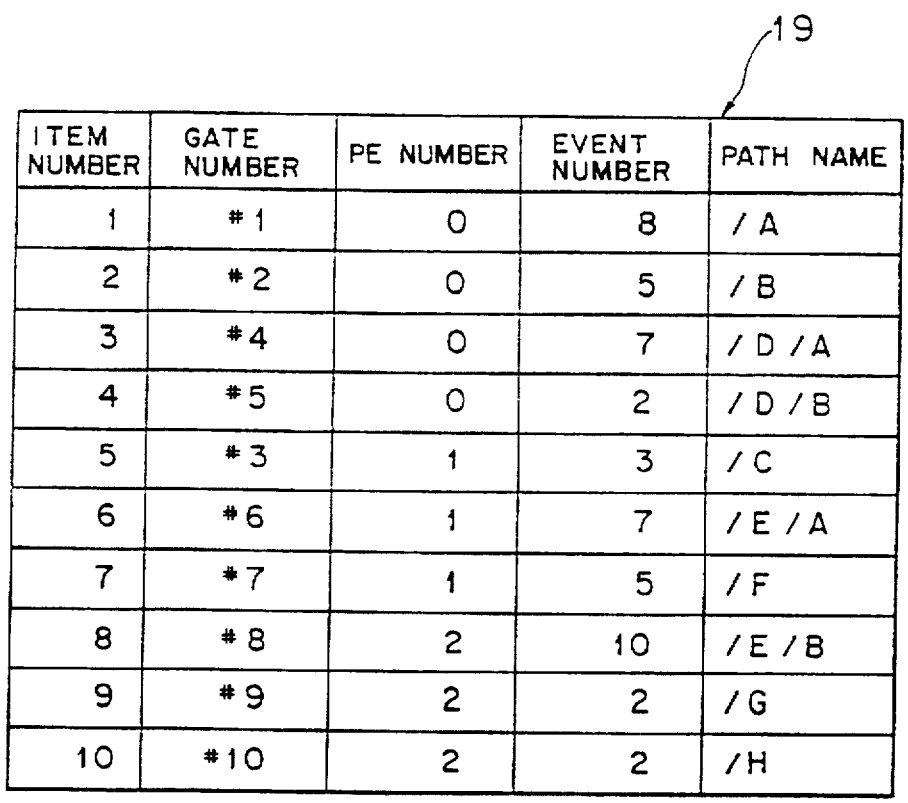
FIG. 19 is a diagram showing an example of the content of the event number data file according to the present embodiment (the event number measured at the time of the logical simulation of the model shown in FIG. 13)

FIG. 19 shows the content of the event number data file 19 obtained when the logical simulation of the model shown in FIG. 13 is executed according to a certain logical simulation execution file 16. The content is the same as the shown in FIG. 15.

Figure 20:
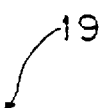
FIG. 20 is a diagram showing another example of the content of the event number data file according to the present embodiment (the event number measured at the time of another logical simulation of the model shown in FIG. 13)

FIG. 20 shows the content of the event number data file 19 obtained when the logical simulation of the model shown in FIG. 13 is executed according to a logical simulation execution file 16 different from that shown in FIG. 19.

The event number data file 19 shown in FIGS. 19 and 20 holds the PE number used for executing an event process every gate number, the event number counted by the counter 17, and the path name.

Figure 21:
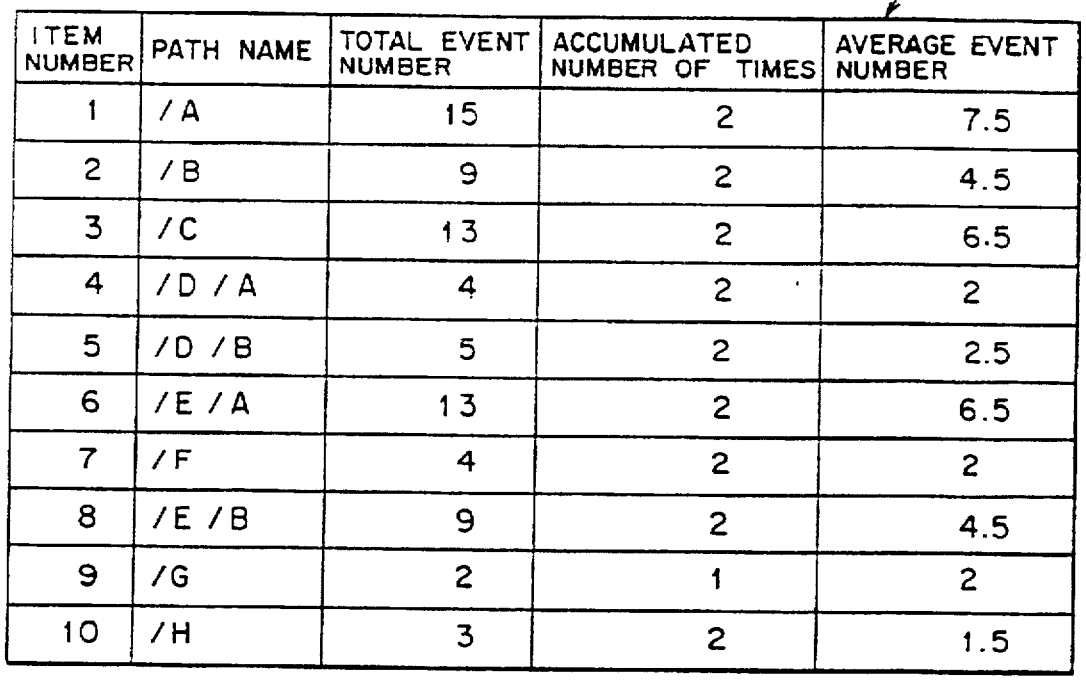
FIG. 21 is a diagram showing the content of a statistical data file newly-created by the event number data accumulating unit of the present embodiment, based on the event number data shown in FIG. 19 and the event number data shown in FIG. 20.

When two event number data files 19 shown in FIGS. 19 and 20 are created, the event number data accumulating unit 21 creates newly the statistical data file 22 including the content shown in FIG. 21, based on the files 19 and according to the process procedure shown in FIG. 17.

The statistical data file 22 shown in FIG. 21 holds the total event number, accumulated count and average event number for each path name. The average event number of each path name is obtained by dividing the sum (total event number) of the event number held in the file 19 shown in FIG. 19 and the event number held in the file 19 shown in FIG. 20 by the corresponding accumulated count.

Figure 22:
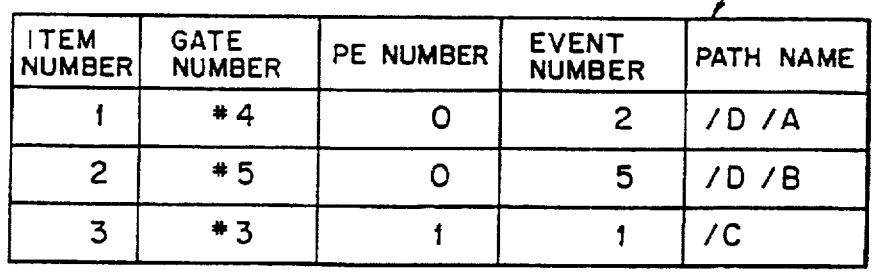
FIG. 22 is a diagram showing the content of another file further different from the event number data file according to the present embodiment (the event number measured at a further different logical simulation time of the model shown in FIG. 13)

Moreover, it is assumed that the event number data file 19 having the content shown in FIG. 22 is obtained when the logical simulation of the model shown in FIG. 13 is performed according to the logical simulation execution file 16 different from that shown in FIGS. 19 and 20.

In this case, as shown in FIG. 23, the event number data accumulating unit 21 updates and recreates the content of the statistical data file 22 shown in FIG. 21, based on the statistical data file shown in FIG. 21 and the event number data file 19 shown in FIG. 22 and according to the process procedure shown in FIG. 18.

The statistical data file 22 shown in FIG. 23 holds the total event number, accumulated count, and average event number for each path name. The average event number of each path name is obtained by dividing the sum of the event number held in the file 22 shown in FIG. 21 and the event number held in the file 19 shown in FIG. 22 by the corresponding accumulated count.

(B-4-6) Evaluation Function and Concrete Logical Simulation Model Created Using Evaluation Function:

As described before, according to the present embodiment, the gate is allocated to reduce the bias of the event number of each PE11a, thus reducing the load bias of each PE11a.

According to the present embodiment, in order to realize the gate allocation (gate allocation), the model creating unit 13 or the model recreating unit 20 creates a logical simulation model by searching for the gate allocation which minimizes the evaluation function F1 expressed by the following formula (1) and the evaluation function F2 expressed by the following formula (2).

$$F1 = \sum_{n=0}^{N} |E_{PEn} - \overline{E_{PE}}| \quad (1)$$

$$F2 = \sum_{n=0}^{N} (E_{PEn} - \overline{E_{PE}})^2 \quad (2)$$

where EPE0 is an event number of PE0.

EPE1 is an event number of PE1.

EPEn is an event number of PEn.

EPE is an average value of an event number per PE.

N is (total number of PEs−1)

The concrete logical simulation model created using the evaluation functions F1 and F2 will be explained below by referring to FIGS. 24 to 28.

Figure 24:
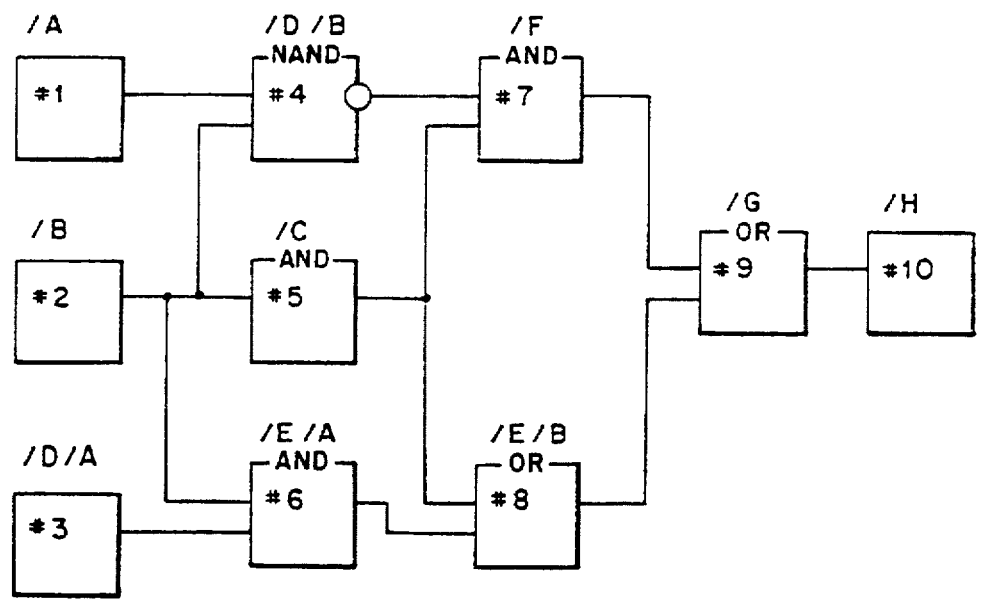
FIG. 24 is a diagram showing an example of design data with a path name.

FIG. 24 shows the design data of a logic circuit being an object of a logical simulation. As shown in FIG. 24, the design data is equivalent to that shown in FIG. 13. In FIG. 24, path names are attached to the blocks showing the gates #1 to #10 respectively.

In assumption, a logical simulation model is created by allocating the gates #1 to #10 corresponding to the design data shown in FIG. 24 to three PE0, PE1, and PE2, as shown in FIG. 13. The data file 19 holding the event number of the content shown in FIG. 25 is obtained by executing a logical simulation according to a certain logical simulation execution file 16 in the logical simulation model.

Figure 26:
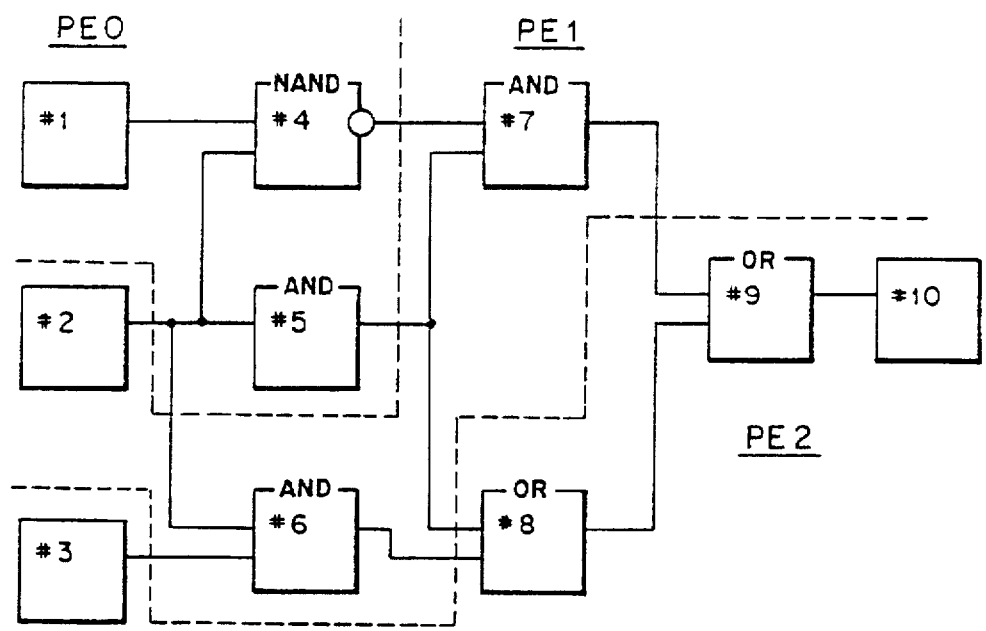
FIG. 26 is a diagram showing an example of a logical simulation model created by a logical simulation model creating unit of the present embodiment, based on the design data shown in FIG. 24 and the event number data shown in FIG. 25.

At this time, the logical simulation model for the gate allocation shown in FIG. 26 is created using the evaluation function F1 expressed by the formula (1).

In the model shown in FIG. 13, the event process of the gates #1, #2, #4 and #5 is allocated to the PE0. The event process of the gates #3, #6 and #7 is allocated to the PE1. The event process of the gates #8, #9 and #10 is allocated to the PE2. The event number of the PE0 is 24. The event number of the PE1 is 17. The event number of the PE2 is 10.

In the model shown in FIG. 26, the event process of the gates #1, #4 and #5 is allocated to the PE0. The event process of the gates #2, #6 and #7 is allocated to the PE1. The event process of the gates #3, #8, #9 and #10 is allocated to the PE2. The event number of the PE0 is 19. The event number of the PE1 is 17. The event number of the PE2 is 15. Thus, in comparison with the model shown in FIG. 13, a logical simulation model with a much smaller load bias of each of the PE0, PE1 and PE2 is created.

In the logical simulation model for the design data shown in FIG. 24, the statistical data file 22 including the content shown in FIG. 27 is obtained by executing a logical simulation according to plural logical simulation execution files 16.

Figure 28:
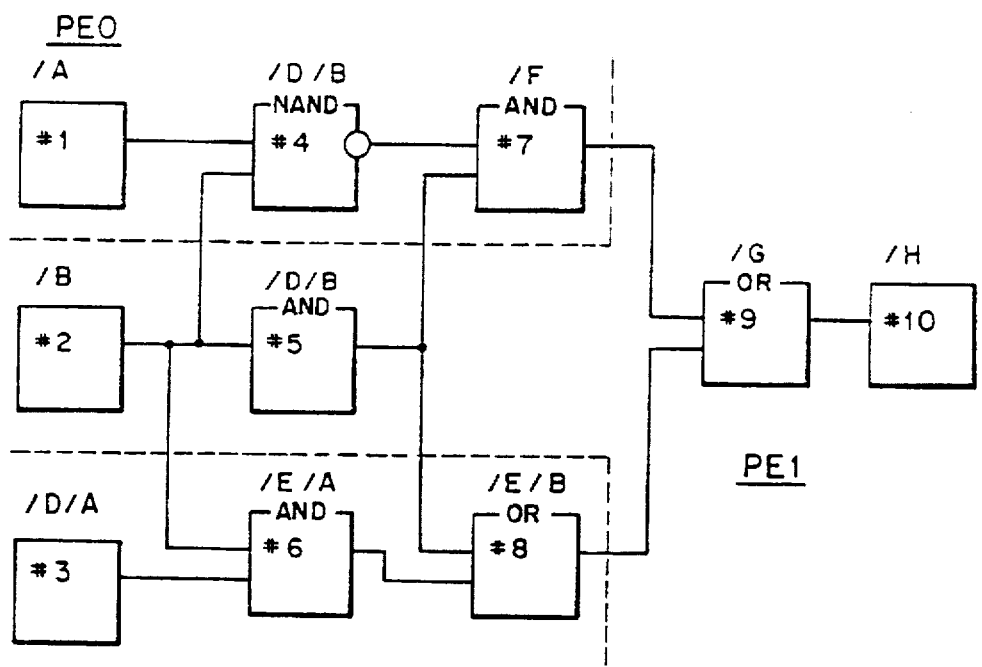
FIG. 28 is a diagram showing an example of a logical simulation model created by the logical simulation model creating unit of the present embodiment, based on the design data shown in FIG. 24 and the statistical data shown in FIG. 27.

The logical simulation model for the gate allocation shown in FIG. 28 is created by using the evaluation function F2 expressed by the formula (2).

In the model shown in FIG. 28, the event process of the gates #1, #4 and #7 is allocated to the PE0. The event process of the gates #2, #5, #9 and #10 is allocated to the PE1. The event process of the gates #3, #6 and #8 is allocated to the PE2. The total average event number to be processed by the PE0 is 90. The total average event number to be processed by the PE1 is 90. The total average event number of the PE2 is 90. Thus, a logical simulation model in which the loads of the PEs 0 to 2 are averaged is created.

Figure 29:
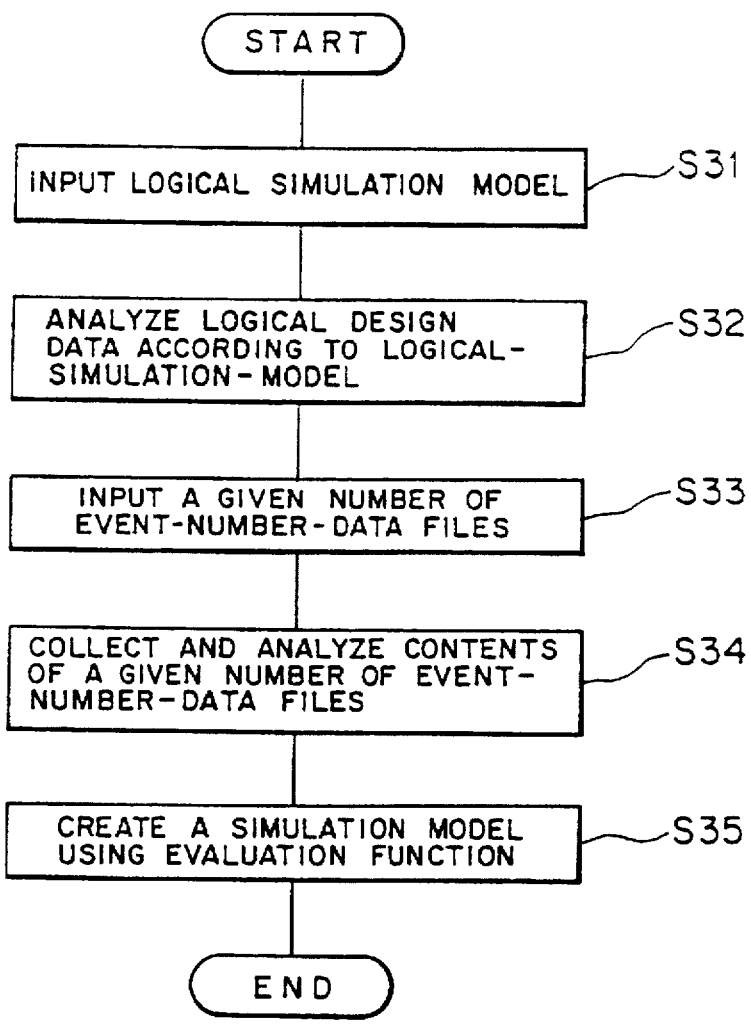
FIG. 29 is a flowchart used for explaining the process procedure in the logical simulation model recreating unit of the present embodiment.
Figure 30:
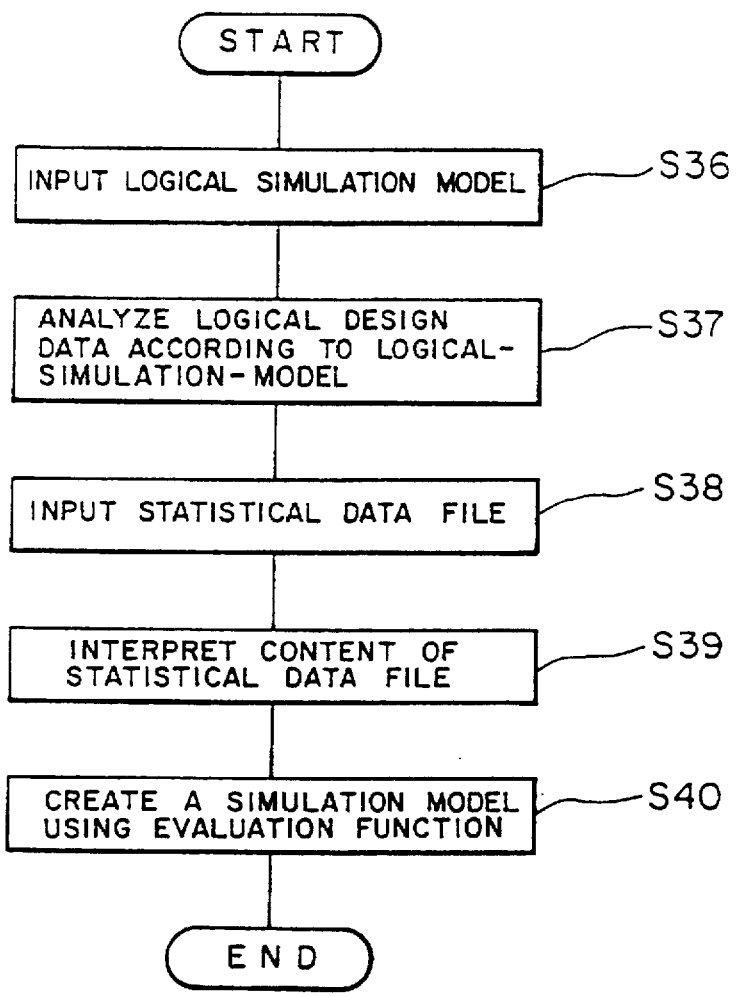
FIG. 30 is a flowchart used for explaining another process procedure in the logical simulation model recreating unit of the present embodiment.

(B-4-7) Process Procedure of the Logical Simulation Model Recreating Unit 20 of the Present Embodiment:

The logical simulation model recreating unit 20 of the present embodiment shown in FIG. 2 operates according to the process procedure shown in FIG. 29 or 30.

The operation of recreating a logical simulation model based on the logical simulation model and the event number data will be explained below according to the flowchart (steps S31 to S35) shown in FIG. 29.

When the logical simulation model is recreated, the model recreating unit 20 receives a logical simulation model held in the model file 14 (step S31) and then analyzes the design logical data according to the logical simulation model (step S32).

The model recreating unit 20 receives a given number of event number data files 19 each holding the result counted by the counter 17 (step S33), accumulates and analyzes the contents of the files 19 (step S34), and then recreates the logical simulation model to reduce the bias of the load (the event number to be processed) of each PE PE11a, using the data obtained by the analyzing process in the steps S32 and S34 and evaluation functions F1 and F2 (step S35).

The operation in which a logical simulation model is recreated based on the logical simulation model and the statistical data will be explained below according to the flowchart (steps S36 to S39) shown in FIG. 30.

When the logical simulation model is recreated, the model recreating unit 20 receives a logical simulation model holding in the model file 14 (step S36) and analyzes the design logical data according to the logical simulation model (step S37).

The model recreating unit 20 receives the statistical data file 22 (step S38), analyzes the content of the statistical file 22 (step S39) and then recreates a logical simulation model with a small bias of the load (the event number to be processed) of each PE11a, using the data obtained by the process in the steps S37 and S39 and the evaluation functions F1 or F2 (step S40). (B-5) Concrete Function and Effect of the Logical Simulator 10 of the Present Embodiment:

Next, the concrete example in which a high-speed logical simulation can be realized by creating a logical simulation with a small bias of the load (the event number to be processed) of each PE11a at a logical simulation execution time will be explained below by referring to FIGS. 31 to 35.

As briefly described in the step S12 shown in FIG. 4, the concrete function and effect will be explained below by referring to FIGS. 31 to 39, in the case where there is a logical simulation model for the design data similar to new design data created according to the technique (the process in the steps S16 and S20 shown in FIG. 4) of the present embodiment when a logical simulation model is created in the step S12.

Figures 31, 32, 33:
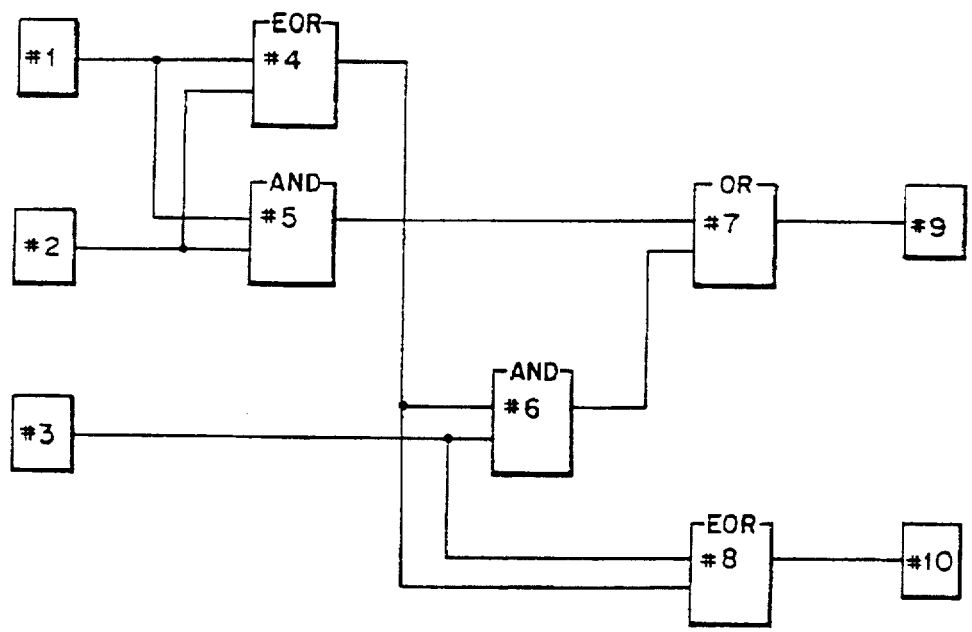
FIG. 31 is a diagram showing an example of design data.
FIG. 32 is a diagram showing a test pattern (input pattern) used when the design data shown in FIG. 31 is subjected to a logical simulation.
FIG. 33 is a diagram showing the event number occurred in each gate when the test pattern shown in FIG. 32 is input to the model shown in FIG. 31.

For example, the case where a logical simulation model of the design data shown in FIG. 31 is newly created will be explained below. In this case, like the examples shown in FIGS. 13 to 15, the test pattern shown in FIG. 32 is input to the logical simulation model (input gates #1 to #3) and the event number data shown in FIG. 33 is obtained for the gates #1 to #10 by means of the counter 17.

In the same manner as those shown in FIGS. 6 and 13, each block in FIG. 31 represents a gate. The gate numbers #1 to #10 marked in blocks specify gates respectively. In FIG. 31, #1 to #3 represent input gates. #4 represents a 2-input EOR gate. #5 and #6 represent 2-input AND gates. #7 represents a 2-input OR gate. #8 represents a 2-input EOR gate. #9 and #10 represent output gates.

A logical simulation model is created by dividing (allocating) the design data shown in FIG. 31 into, for example, two PEs11a (hereinafter abbreviated to as PE0 and PE1 respectively; 0 and 1 are represented the processor number of each PE). In the general technique, as shown in FIG. 34(a), the event process of each of the odd-numbered gates #1, #3, #5, #7 and #9 is allocated to the PE0 by merely following the gate number of design data. The event process of each of the evennumbered gates #2, #4, #6, #8 and #10 is allocated to the PE1. In this case, the process event number of the PE0 is 20 but the process event number of the PE1 is 31.

In the logical simulation model created (recreated) using the evaluation function F1 in the steps S16 or S20 (that is, the model creating unit 13 or the model recreating unit 20) shown in FIG. 3, a gate allocation is performed to allocate evenly the event number processed by the PE0 and PE1, as shown in FIG. 34(b). That is, the event process of each of the gates #1, #3, #4, #7 and #8 is allocated to the PE 0. The event process of each of the gates #2, #5, #6, #9 and #10 is allocated to the PE1. In this case, the event number processed in the PE0 is 27, but the event number processed in the PE1 is 24.

In the case where a logical simulation model (general model) in which the gates are allocated as shown in FIG. 34(a) is applied to the left-half portion shown in FIG. 35, the event process execution procedure (time taken in a logical simulation) is shown with the gate number for the input pattern. On the other hand, in the case where a logical simulation model (a model according to the present embodiment) in which the gates are divided as shown in FIG. 34(b) is used to the right-half portion shown in FIG. 35, the event process executive procedure (time taken in a logical simulation) of each of PEs 0 and 1 is shown with the gate number for the input pattern. In FIGS. 34 and 35, the symbol # for the gate number is omitted.

FIG. 35 shows 4 input patterns in which the logical simulation time is shortened by the model of the present embodiment, 2 input patterns in which the logical simulation time is prolonged, and 2 input patterns in which there is no change in simulation time. That is, some input patterns prolong the logical simulation time by the model of the present embodiment. However, there are, as a whole, most of input patterns time-shortened. It is understood that the technique according to the present embodiment can realize the logical simulation at high speed.

Figures 36, 37:
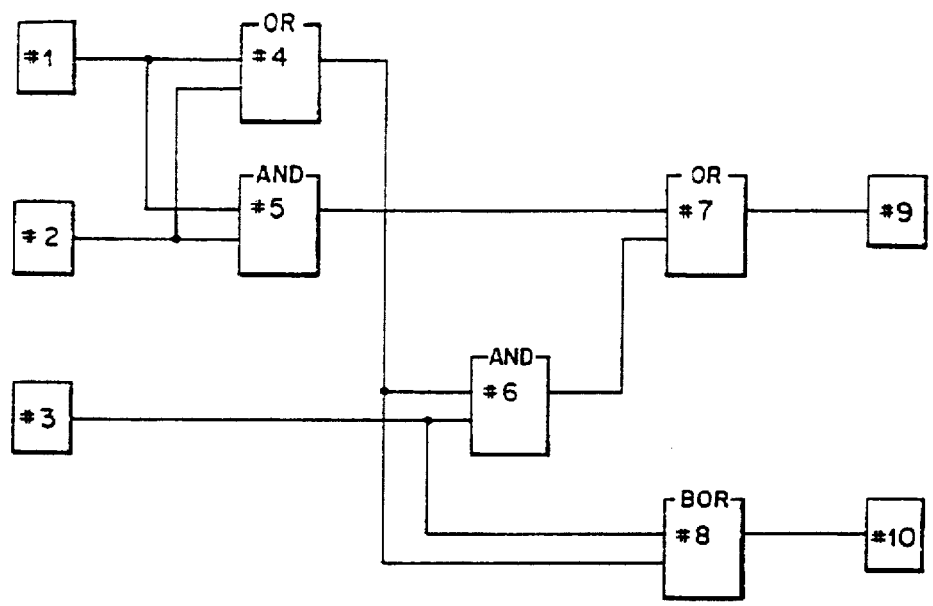
FIG. 36 is a diagram showing another design data analogous to design data shown in FIG. 31.
FIG. 37 is a diagram showing the event number occurred in each gate when the test pattern shown in FIG. 32 is input to the model shown in FIG. 36.
Figure 40:
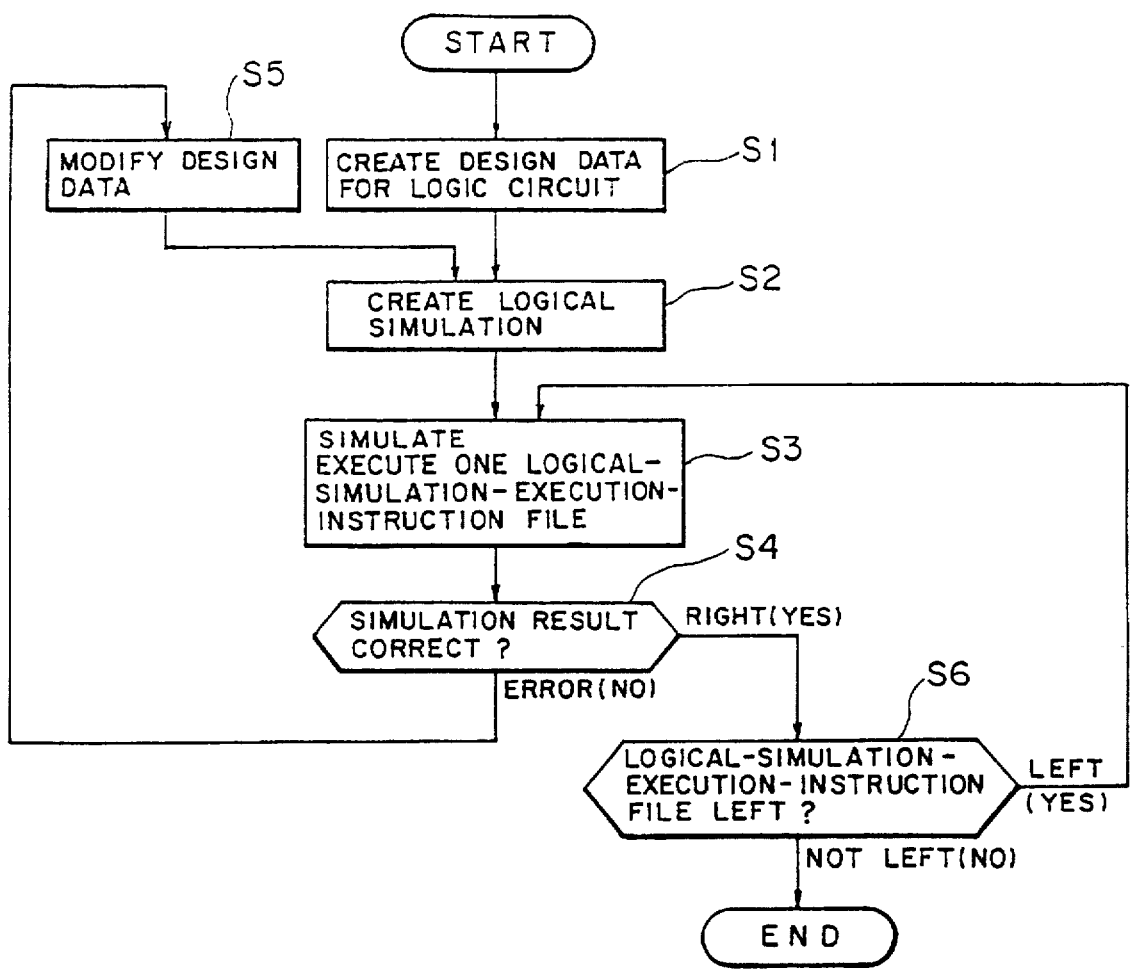
FIG. 40 is a flowchart used for explaining a conventional logical simulation procedure.

After a logical simulation model is created by subjecting the design data shown in FIG. 31 to the gate allocation shown in FIG. 34(b), the design data shown in FIG. 36, for example, similar to the design data shown in FIG. 31 is subjected to the logical simulation. In this case, as described before in the step S12 shown in FIG. 4, the logical simulation model shown in FIG. 34(b) created for the design data shown in FIG. 31 is used without any change. The design data shown in FIG. 36 differs from the design data shown in FIG. 31 in that the gate #4 is changed from a 2-input EOR gate to a 2-input OR gate.

When the logical simulation model (input gates #1 to #3) of the design data shown in FIG. 36 is input to the test pattern shown in FIG. 32, the event numbers each which is issued in each of the gates #1 to #10 are shown in FIG. 37. The event numbers are not yet counted at the model creation time in the step 12 in FIG. 4. However, it has been previously explained that the technique of the present embodiment can evenly distribute the load (event number). The underlined numbers shown in FIG. 37 are ones obtained by changing the event number shown in FIG. 33 with the design data varied.

In the general technique, like the example shown in FIG. 34(a), when the logical simulation model in which the design data shown in FIG. 36 is divided (allocated) into two PE0 and PE1 is created, the event process of each of the odd-numbered gates #1, #3, #5, #7 and #9 is allocated to the PE0 while the event process of each of the even-numbered gates #2, #4, #6, #8 and #10 is allocated to the PE1, as shown in FIG. 38(a). In this case, the process event number of the PE0 is 20 while the process event number of the PE1 is 28.

In contrast, when the model shown in FIG. 34(b) as a logical simulation model of the similar design data is used as the logical simulation model of the design data shown in FIG. 36 without any change, the event process of each of the gates #1, #3, #4, #7 and #8 is allocated to the PE0 while the event process of each of the gates #2, #5, #6, #9 and #10 is allocated to the PE1. In this case, the process event number of the PE0 is 25 while the process event number of the PE1 is 23.

When the logical simulation model (general model) in which the gates are divided as shown in FIG. 38(a) is used to the left-hand portion shown in FIG. 39, the event process executive procedure (time taken in a logical simulation) of each of the PE0 and PE1 is shown with the gate number at every input pattern. On the other hand, when the logical simulation model (a similar model in the present embodiment) in which the gates are divided as shown in FIG. 38(b) is used to the right-hand portion shown in FIG. 39, the event process executive procedure (time taken in a logical simulation) of each of the PE0 and PE1 is shown with the gate number at every input pattern. In FIGS. 38 and 39, the symbol # for the gate number is omitted.

Like the input pattern shown in FIG. 35, there are 4 input patterns in which the logical simulation time is shortened by the model similar to the present embodiment, 2 input patterns in which the logical simulation time is prolonged, and 2 input patterns in which the logical simulation time is not changed, as shown in FIG. 39. That is, some similar input patterns of the present embodiment prolong the logical simulation time.

However, as a whole, the logical simulation time is shortened in most logical simulation models. Therefore, it is understood that the high speed of the logical simulation can be realized by creating the logical simulation model for design data with similarity without any change.

In the present embodiment, for the brief explanation, the number of gates for the design data is at most 10. However, in actual design data, the number of gates is over one million.

When it is considered that the logical simulation is subjected to such a huge number of gates, the logical simulation time of the present embodiment can be reduced by 10–20%, compared with the logical simulation time in the general technique.

In the above embodiment, it has been explained to create the logical simulation model in which the gate of the design data is allocated to 2 or 3 PEs11a. However, it should be noted that the number of gates are not limited only to the abovementioned values.

What is claimed is:

1. A logical simulator comprising:
a parallel-processing-type hardware formed of plural processing elements;
a design data file for holding design data of a logic circuit to be logically simulated;
a model creating unit for creating a logical simulation model according to the design data held in said design data file;
a model file for holding a logical simulation model created with said model creating unit;
a logical simulation executing unit for making each of said processing elements in said parallel-processing-type hardware to execute said logical simulation according to said logical simulation model held in said model file;
a load measuring unit for measuring the load of each of said processing elements at a logical simulation execution time; and
a load data file for holding as load data the result measured by said load measuring unit;
said model creating unit creating a logical simulation model based on the measured result from said load measuring unit held in said load data file to thereby more evenly distribute the load of each of said processing elements at the logical simulation time,
wherein said load measuring unit measures an event number in an event drive mode as load data of each of said processing elements.

2. The logical simulator according to claim 1, further comprising a model recreating unit that recreates a logical simulation model based on said logical simulation model held in said model file and the measured result from said load measuring unit to thereby more evenly distribute the load of each of said processing elements at the logical simulation time.

3. The logical simulator according to claim 1, wherein said load measuring unit measures the event number in a previously-designated time slot during a logical simulation period of said parallel-processing-type hardware.

4. The logical simulator according to claim 1, further comprising:

a data accumulating unit for accumulating and analyzing the event numbers measured by said load measuring unit at said logical simulation execution time and held in said load data file; and
a statistical data file for holding statistical data created by said data accumulating unit.

5. The logical simulator according to claim 3, further comprising:
a data accumulating unit for accumulating and analyzing the event numbers measured by said load measuring unit at said logical simulation execution time and held in said load data file; and
a statistical data file for holding statistical data created by said data accumulating unit.

6. The logical simulator according to claim 4, wherein said data accumulating unit recreates the statistical data, based on the event number held in said load data file and the existing statistical data held in said statistical data file, after the logical simulation is executed to design data already used to create statistical data, and then stores it to said statistical data file.

7. The logical simulator according to claim 5, wherein said data accumulating unit recreates the statistical data, based on the event number held in said load data file and the existing statistical data held in said statistical data file, after the logical simulation is executed to design data already used to create statistical data, and then stores it to said statistical data file.

8. The logical simulator according to claim 1, wherein said model creating unit creates a logical simulation model with a small load bias of each of said processing elements at a logical simulation execution time, based on the event number held in said load data file and design data held in said design data file.

9. The logical simulator according to claim 3, wherein said model creating unit creates a logical simulation model with a small load bias of each of said processing elements at a logical simulation execution time, based on the event number held in said load data file and design data held in said design data file.

10. The logical simulator according to claim 4, wherein said model creating unit creates a logical simulation model with a small load bias of each of said processing elements at a logical simulation execution time, based on the statistical data held in said statistical data file and design data held in said design data file.

11. The logical simulator according to claim 5, wherein said model creating unit creates a logical simulation model with a small load bias of each of said processing elements at a logical simulation execution time, based on the statistical data held in said statistical data file and design data held in said design data file.

12. The logical simulator according to claim 6, wherein said model creating unit creates a logical simulation model with a small load bias of each of said processing elements at a logical simulation execution time, based on the statistical data held in said statistical data file and design data held in said design data file.

13. The logical simulator according to claim 7, wherein said model creating unit creates a logical simulation model with a small load bias of each of said processing elements at a logical simulation execution time, based on the statistical data held in said statistical data file and design data held in said design data file.

14. The logical simulator according to claim 1, wherein said model creating unit creates a logical simulation model with a small load bias of each of said processing elements at a logical simulation execution time, based on the event number held in said load data file and the logical simulation model held in said model file.

15. The logical simulator according to claim 3, wherein said model recreating unit recreates a logical simulation model with a small load bias of each of said processing elements at a logical simulation execution time, based on the event number held in said load data file and the logical simulation model held in said model file.

16. The logical simulator according to claim 4, wherein said model recreating unit recreates a logical simulation model with a small load bias of each of said processing elements at a logical simulation execution time, based on the event number held in said load data file and the logical simulation model held in said model file.

17. The logical simulator according to claim 6, wherein said model recreating unit recreates a logical simulation model with a small load bias of each of said processing elements at a logical simulation execution time, based on the event number held in said load data file and the logical simulation model held in said model file.

18. The logical simulator according to claim 6, wherein said model recreating unit recreates a logical simulation model with a small load bias of each of said processing elements at a logical simulation execution time, based on the statistical data held in said statistical data file and the logical simulation model held in said model file.

19. The logical simulator according to claim 7, wherein said model recreating unit recreates a logical simulation model with a small load bias of each of said processing elements at a logical simulation execution time, based on the statistical data held in said statistical data file and the logical simulation model held in said model file.

* * * * *